US012701675B2

(12) United States Patent
Karamanis et al.

(10) Patent No.: US 12,701,675 B2
(45) Date of Patent: Aug. 4, 2026

(54) COMPLIANT COOLING PLATES

(71) Applicant: ThermoTech Holdings LLC, Greenville, SC (US)

(72) Inventors: Georgios Karamanis, Medford, MA (US); Marc Hodes, Cambridge, MA (US)

(73) Assignee: THERMOTECH HOLDINGS LLC, Greenville, SC (US)

( * ) Notice: Subject to any disclaimer, the term of this patent is extended or adjusted under 35 U.S.C. 154(b) by 160 days.

(21) Appl. No.: 18/366,476

(22) Filed: Aug. 7, 2023

(65) Prior Publication Data

US 2024/0049431 A1 Feb. 8, 2024

Related U.S. Application Data

(60) Provisional application No. 63/395,731, filed on Aug. 5, 2022.

(51) Int. Cl.
H05K 7/20 (2006.01)
H01L 23/433 (2006.01)
(Continued)

(52) U.S. Cl.
CPC ........ H05K 7/20436 (2013.01); H10W 40/47 (2026.01); H10W 40/772 (2026.01)

(58) Field of Classification Search
CPC .............. H01L 23/473; H05K 7/20309; H05K 7/20436; H05K 7/4332
See application file for complete search history.

(56) References Cited

U.S. PATENT DOCUMENTS 4,138,692 A    2/1979  Meeker et al.
4,825,284 A *  4/1989  Soga ..................... H01L 21/563
                                                257/E23.091
(Continued)

FOREIGN PATENT DOCUMENTS

EP           0435586 A2    7/1991
JP           S61279157 A  12/1986
WO     WO 2021/178722 A1   9/2021

OTHER PUBLICATIONS

International Search Report and Written Opinion for Application PCT/US2023/029607, mailed May 12, 2023, 8 pages.
(Continued)

*Primary Examiner* — Eric S Ruppert
*Assistant Examiner* — Hans R Weiland
(74) *Attorney, Agent, or Firm* — Dority & Manning, P.A.

(57) ABSTRACT

Cooling plates are generally directed to accommodating static and dynamic variations in heat dissipation requirements across a plurality of heat-dissipating components while maintaining efficient transfer of heat away from the heat-dissipating components. For example, a cooling plate may include a housing, a diaphragm, a plurality of ribs, and at least one fin. The housing and the diaphragm may collectively define a chamber enclosed relative to a contact surface of the diaphragm. The plurality of ribs and the at least one fin collectively defining a plurality of channels in the chamber. The at least one fin may be coupled to the diaphragm in the chamber, and the at least one fin may be movable toward the housing (e.g., to define at least a portion of a subset of the plurality of channels) in response to external pressure on the contact surface from one or more heat-dissipating devices of a circuit pack.

18 Claims, 16 Drawing Sheets

(51) Int. Cl.
    *H01L 23/473*     (2006.01)
    *H10W 40/47*     (2026.01)
    *H10W 40/77*     (2026.01)

(56)                   References Cited

U.S. PATENT DOCUMENTS

| | | | |
|---|---|---|---|
| 4,879,632 A * | 11/1989 | Yamamoto | G11B 11/10591 257/E23.091 |
| 5,006,924 A * | 4/1991 | Frankeny | H01L 25/0655 257/E23.09 |
| 6,082,443 A * | 7/2000 | Yamamoto | F28D 15/046 174/15.2 |
| 2006/0060328 A1 | 3/2006 | Ewes et al. | |
| 2011/0303403 A1* | 12/2011 | Holahan | H01L 23/473 29/890.03 |
| 2013/0199767 A1* | 8/2013 | Karidis | H01L 21/4882 228/183 |
| 2016/0290728 A1* | 10/2016 | Coteus | H05K 7/20254 |
| 2017/0287809 A1* | 10/2017 | Schultz | H01L 23/473 |

OTHER PUBLICATIONS

Sparrow et al., 'Forced convection heat transfer from a shrouded fin array with and without tip clearance', Transactions of the ASME, vol. 100, 1978, pp. 572-579.
Preliminary Report on Patentability for Application PCT/US2023/029607, mailed Feb. 4, 2025, 6 pages.

\* cited by examiner

COMPLIANT COOLING PLATES

CROSS-REFERENCE TO RELATED APPLICATIONS

This application claims the benefit of priority to U.S. Provisional Patent Application No. 63/395,731, filed on Aug. 5, 2022, the entire contents of which are incorporated herein by reference.

BACKGROUND

Heat-dissipating components in electronic or photonic circuit packs are often cooled by coupling these components to a heat-receiving structure, such as a heat sink, a cold plate, the housing of a circuit pack, or an electromagnetic interference (EMI) shield. The total thermal resistance of the thermal path between the heat-dissipating components and the ambient increases with a degree of misalignment between the mating faces of the heat-dissipating components and the heat-receiving structure, such that a gap is present over a portion of one or more mating regions. For example, differences in the stack-up height or coefficients of thermal expansion (CTE) of the adjacent heat-dissipating components may result in some of the heat-dissipating components becoming fully detached from the heat-receiving structure.

In some instances, heat-dissipating components coupled to a thermal management device exhibit static and/or dynamic variations in heat dissipation. Such variations may be intentional and, thus, expected, while other variations may be attributable to variations in performance among the heat-dissipating components. Unless accounted for, such variations in heat-dissipation among heat-dissipating components coupled to a thermal management device may result in an inefficient distribution of cooling across the heat-dissipating components. Further, variations in heat dissipation across heat-dissipating components can result in variations in reliability of the heat-dissipating components, with heat-dissipating components operating at higher temperatures exhibiting, in turn, less reliability.

SUMMARY

Cooling plates are generally directed to accommodating static and dynamic variations in heat dissipation requirements across a plurality of heat-dissipating components on a substrate while maintaining efficient transfer of heat away from the plurality of heat-dissipating components. For example, a cooling plate may include a housing, a diaphragm, a plurality of ribs, and at least one fin. The housing and the diaphragm may collectively define a chamber enclosed relative to a contact surface of the diaphragm. The plurality of ribs and the at least one fin collectively defining a plurality of channels in the chamber. The at least one fin may be coupled to the diaphragm in the chamber, and at least one portion of the at least one fin may be movable toward the housing (e.g., to define at least a portion of a subset of the plurality of channels) in response to external pressure on the contact surface from one or more heat-dissipating devices of a circuit pack. In use, a fluid may be moved through the plurality of channels in the chamber of the cooling plate—and, in particular, moved over the at least one fin in contact with the diaphragm in the chamber—to transfer heat away from the one or more heat-dissipating components in contact with the contact surface of the diaphragm of the cooling plate.

According to one aspect, a cooling plate may include a housing; a diaphragm including a contact surface, the housing supporting the diaphragm, and the housing and the diaphragm collectively defining a chamber enclosed relative to the contact surface; a plurality of ribs disposed in the chamber; and at least one fin including a first end portion and a second end portion, the first end portion coupled to the diaphragm with the second end portion in the chamber, and the at least one fin and the plurality of ribs collectively defining a plurality of channels in the chamber, and at least one portion of the at least one fin movable toward the housing in response to external pressure on the contact surface.

In certain implementations, the housing may include a first section and a second section, the plurality of ribs are disposed between the first section of the housing and the second section of the housing in the chamber. For example, each one of the plurality of ribs may be coupled to the first section of the housing, the second section of the housing, or both. As a more specific example, each one of the plurality of ribs may be welded, brazed, soldered, glued, or skived to the first section of the housing, the second section of the housing, or both. In some instances, the first section of the housing may support the diaphragm, and the at least one portion of the at least one fin is movable toward the second section of the housing in response to external pressure on the contact surface. Additionally, or alternatively, the cooling plate may further include a baffle defining at least one recess, wherein the baffle is coupled to the second section of the housing with the at least one recess open toward the diaphragm, and the at least one fin is movable within the at least one recess in response to external pressure on the contact surface of the diaphragm. As an example, the baffle may include a plurality of supports extending in a direction from the second section of the housing toward the diaphragm, and the plurality of supports are interlaced with the at least one fin to define at least a subset of the plurality of channels therebetween. As a more specific example, in response to external pressure on the contact surface of the diaphragm, the plurality of supports may resist movement of the diaphragm in a direction, into the chamber, toward the second section of the housing.

In some implementations, in the absence of external pressure on the contact surface of the diaphragm, the second end portion of the at least one fin and the housing may define a gap therebetween, and the second end portion of the at least one fin is movable toward the housing in response to the external pressure on the contact surface of the diaphragm. In some instances, the cooling plate may further include a seat disposed between the housing and the second end portion of the at least one fin, wherein the second end portion of the at least one fin is movable into contact with the housing, via the seat, in response to the external pressure on the contact surface. The seat may be supported, for ecample, on the housing, the at least one fin, or a combination thereof. Further, or instead, the seat may be compressible between the second end portion of the at least one fin and the housing as the second end portion of the at least one fin moves toward the housing. Still further, or instead, the seat includes at least one water compatible material. For example, the at least one water compatible material may include synthetic rubber.

In certain implementations, the at least one fin may remain undeformed within an elastic limit of deformation of the diaphragm in a direction normal to the contact surface and toward the chamber.

In some implementations, the at least one portion of the at least one fin may be compressible in response to external pressure on the contact surface of the diaphragm. As an example, the at least one portion of the at least one fin may be corrugated.

In certain implementations, each one of the plurality of channels may be elongate in at least one dimension relative to a respective width of the given channel.

In some implementations, one or more of the plurality of channels has a respective hydraulic diameter of greater than about 1 micron and less than about 1 millimeter.

In certain implementations, the plurality of channels may be in fluid communication with one another within the chamber. As an example, the housing may define a first port and a second port, and the first port and the second port are in fluid communication with one another via the plurality of channels in the chamber.

In some implementations, the housing may include a substantially planar surface, the diaphragm is coupled to the substantially planar surface of the housing, and the contact surface of the diaphragm is raised relative to a plane defined by the substantially planar surface of the housing.

In certain implementations, the plurality of ribs and the at least one fin have the same corrosion potential as one another at least along the plurality of channels in the chamber.

In some implementations, the cooling plate may further include a plurality of struts supported by the at least one fin, the plurality of ribs, or a combination thereof, wherein each one of the plurality of struts is elongate in a direction transverse to a longitudinal axis defined by the first end portion and the second end portion of the at least one fin.

According to another aspect, a circuit pack may include a printed circuit board; at least one heat-dissipating component coupled to the printed circuit board; and any one or more of the cooling plates described herein, the contact surface of the diaphragm in contact with the at least one heat-dissipating component coupled to the printed circuit board, and the at least one fin movable toward the housing of the cooling plate in response to pressure of the at least one heat-dissipating component on the contact surface of the diaphragm.

In some implementations, the circuit pack may further include a fluid and a pump, the pump operable to move the fluid through the plurality of channels in the chamber. For example, the at least one heat-dissipating component may have a predetermined threshold of a junction temperature, and the fluid may have a vaporization temperature lower than the predetermined threshold of the junction temperature. As an example, the fluid may have a vaporization temperature greater than about –271° C. and less than about 2025° C. As a more specific example, the fluid may include water, alcohol, sodium, or a refrigerant.

BRIEF DESCRIPTION OF THE DRAWING

Like reference symbols in the various drawings indicate like elements.

DETAILED DESCRIPTION

Figure 1:
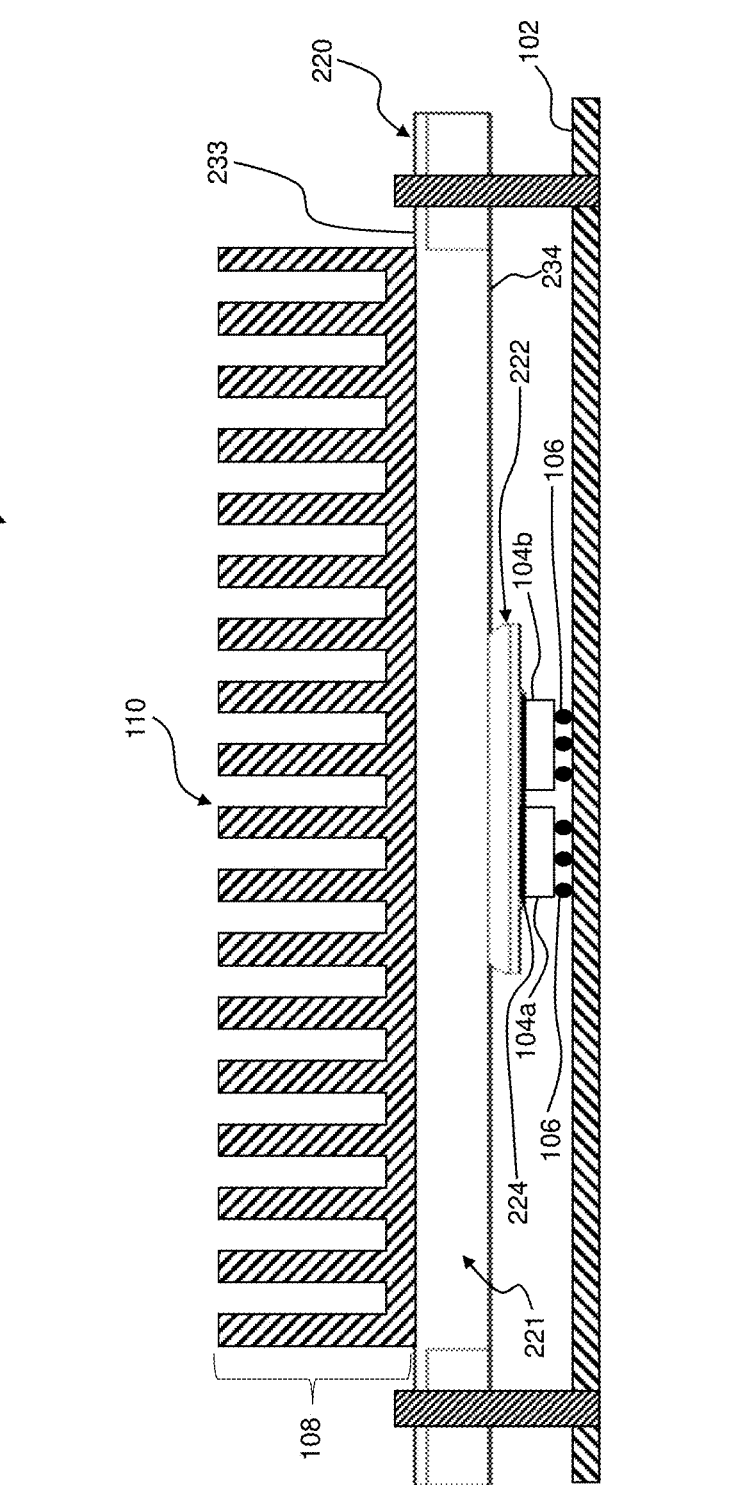
FIG. 1 is a schematic representation of a system including a thermal management device attached to a heat sink and to a heat-dissipating component mounted on a printed circuit board.

The embodiments will now be described more fully hereinafter with reference to the accompanying figures, in which preferred embodiments are shown. The foregoing may, however, be embodied in many different forms and should not be construed as limited to the embodiments set forth herein.

All documents mentioned herein are hereby incorporated by reference in their entirety. References to items in the singular should be understood to include items in the plural, and vice versa, unless explicitly stated otherwise or clear from the context. Grammatical conjunctions are intended to express any and all disjunctive and conjunctive combinations of conjoined clauses, sentences, words, and the like, unless otherwise stated or clear from the context. Thus, the term "or" should generally be understood to mean "and/or," and the term "and" should generally be understood to mean "and/or."

Recitation of ranges of values herein are not intended to be limiting, referring instead individually to any and all values falling within the range, unless otherwise indicated herein, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples or exemplary language ("e.g.," "such as," or the like) provided herein, is intended to better describe the embodiments and does not pose a limitation on the scope of the embodiments or the claims. No language in the specification should be construed as indicating any unclaimed element as essential to the practice of the disclosed embodiments.

As used herein, the term "heat-dissipating" component is used to refer to any one or more of various different types of electronic and/or optoelectronic components, unless otherwise specified or made clear from the context. Such heat-dissipating components may be present in any one or more of various different numbers and arrangements within a circuit pack, unless a contrary intent is explicitly set forth. By way of example, and not limitation, such heat-dissipating components may include field programmable gate arrays (FPGAs), microprocessors, laser drivers, optical amplifiers, lasers to generate light for transmission of information in fiber optic networks, or a combination thereof. Further, in each instance in which heat-dissipating components are described as being cooled herein, it shall be understood that any one or more of various different electronic and/or optoelectronic components may be additionally, or alternatively, heated by reversing a direction of heat transfer. Such heating may be useful, for example, for maintaining an electronic and/or optoelectronic component within a temperature range associated with rated performance, even though the component may be a heat-dissipating component. Thus, stated differently, the term "heat-dissipating" component is used herein, as a matter of linguistic convenience, to refer to any one or more of various different electronic and/or optoelectronic components and shall not be understood to imply a direction of heat transfer. That is, unless otherwise specified or made clear from the context, any one or more of the various different thermal management devices described herein shall be understood to be operable to heat and/or cool one or more heat-dissipating components. More specifically, while a first portion of a thermal management device may be described as being a condenser and a second portion of the thermal management device may be described as being an evaporator, it shall be understood that these functions may be reversed according to an intended direction of heat transfer. For the sake of clear and efficient description such reversibility shall be understood and is not described separately in the description below.

In the description that follows, aspects of certain thermal management devices are described with respect to heat transfer from a pair of heat-dissipating components. It shall be appreciated that this is for the sake of clear and efficient description, and shall not be considered limiting. That is, unless otherwise specified or made clear from the context, any one or more of the various different aspects of thermal management devices and associated systems and methods of fabrication described herein shall be understood to be applicable to thermal management of any number of heat-dissipating components, unless otherwise specified or made clear from the context. Further, each heat-dissipating component may include any number of heat-dissipating sub-components, an examples of which include multichip modules in central processing units (CPUs), graphics processing units (GPUs), and fused CPU-GPU architectures. Such heat-dissipating sub-components may be in a bare die (unpackaged state). In other cases, all or some of the heat-dissipating sub-components may be individually packaged. Further, or instead, any one or more of the heat-dissipating components described herein may be packaged in a case. Heat-dissipating sub-components may be coupled to the case such that the case may act as a component-level heat receiving structure which, in turn, can be coupled to a circuit pack-level heat-receiving structure. Still further, or instead, heat-dissipating components with heat-dissipating sub-components may be themselves in a packaged configuration rather than in a bare die configuration. Further, or instead, heat-dissipating components described herein shall be understood to include multi-chip modules in which a plurality of chips are coupled to a lid of a multi-chip module or an analogous configuration with a bare die multi-chip module. Unless otherwise specified or made clear from the context, the foregoing and any other configurations of heat-dissipating components and/or heat-dissipating sub-components shall be understood to be within the subject matter of the present disclosure.

In the discussion that follows, the term "wick" shall be understood to include any manner and form of porous material along which a liquid may be absorbed along a first portion of a chamber of a thermal management device and distributed, without an external energy source, to a second portion of the chamber as part of a heating or cooling cycle carried out between the first portion of the chamber and the second portion of the chamber. Further, for the sake of convenience, the term "wick" shall be understood to include a continuous material, as well as discrete sections of material along which a liquid may be transported (e.g., via direct contact between discrete sections and/or via an artery), unless otherwise specified or made clear from the context.

Referring now to FIG. 1, a system 100 may include a printed circuit board 102, heat-dissipating components 104a,b (referred to collectively as the heat-dissipating components 104a,b and individually as the first heat-dissipating component 104a and the second heat-dissipating component 104b), and a thermal management device 220. Each one of the heat-dissipating components 104a,b may be coupled on the printed circuit board 102 (e.g., at a respective solder joint 106) in any one or more of various different arrangements suitable for a given circuit pack, such as an electronic circuit pack, optoelectronic circuit pack, or combinations thereof, used in computing and/or telecommunications hardware as found in telecommunications centers and data centers or as found in stand-alone systems (e.g., personal computers, smartphones, or lab equipment). The thermal management device 220 may include a housing 221 and a diaphragm 222. The diaphragm 222 may be supported along the housing 221 and in contact with each one of the heat-dissipating components 104a,b. As described in greater detail below, the diaphragm 222 may be resiliently flexible such that a contact surface 224 of the diaphragm 222 conforms to each one of the first heat-dissipating component 104a and the second heat-dissipating component 104b. Such resilient flexibility of the diaphragm 222 may, for example, reduce the likelihood of air gaps between the thermal management device 220 and the heat-dissipating components 104a,b by accommodating geometric variations (e.g., misalignment, thermal expansion mismatch, stack-up height variations, etc.) between the first heat-dissipating component 104a and the second heat-dissipating component 104b. That is, resilient flexibility of the diaphragm 222 may increase the likelihood of solid-to-solid contact between the thermal management device 220 and each of the heat-dissipating components 104a,b. As also described in greater detail below, the diaphragm 222 may be at least partially formed of one or more highly conductive materials (e.g., one or more metals, such as copper). Thus, as compared to thermal resistance associated with the use of thermal paste or elastomeric fillers to account for geometric variations between heat-dissipating components and a heat-receiving structure, the combination of resilient flexibility and high thermal conductivity of the diaphragm 222 may facilitate achieving a lower thermal resistance thermal path—and, thus, more efficient heat transfer—between the thermal management device 220 and each of the first heat-dissipating component 104 and the second heat-dissipating component. As further compared to the use of thermal paste or elastomeric fillers, the thermal management device 220 may additionally, or alternatively, facilitate assembly and offer advantages with respect to durability over time.

The thermal management device 220 may cool the heat-dissipating components 104a,b using an evaporation and condensation loop of a fluid, as described in greater detail below. In certain implementations, such cooling provided by the thermal management device 220 alone may maintain the heat-dissipating components 104a,b within a temperature range associated with reliable and prolonged operation of the heat-dissipating components 104a,b. In other implementations, however, the system 100 may additionally include a heat exchanger 108 coupled to the housing 221 of the thermal management device 220. For example, the heat exchanger 108 may be coupled to the housing 221 away from the diaphragm 222, to facilitate creating a temperature gradient away from the heat-dissipating components 104a,b, as may be useful for evaporating and condensing the fluid within the thermal management device 220 to cool the heat-dissipating components 104a,b. Further, or instead, the heat exchanger 108 may be coupled to a portion of the housing 221 facing away from the heat-dissipating components 104a,b, with such positioning being useful for sizing the heat exchanger 108 with a large surface area in some instances. As an example, the heat exchanger 108 may include a plurality of fins 110. In a position away from away from the heat-dissipating components 104a,b and, thus, away from the printed circuit board 102, the size of the plurality of fins 110 may be less likely to be constrained by the printed circuit board 102. Additionally, or alternatively, the heat exchanger 108 may include a cold plate such that a coolant (e.g., water) may flow through the heat exchanger 108 to draw heat away from the housing 221.

In general, referring now to FIG. 1 and FIGS. 2A-2D, the thermal management device 220 may include the housing 221, the diaphragm 222, at least one instance of a support 226 (referred to hereinafter as the support 226), and a wick 228. The housing 221 and the diaphragm 222 may define a chamber 230 enclosed relative to the contact surface 224 of the diaphragm 222 such that the contact surface 224 of the diaphragm 222 faces away from the chamber 230. The support 226 may be disposed in the chamber 230. While the diaphragm 222 may be a flexible material, the diaphragm 222 supported by the housing 221 and the support 226 may resist deformation of the diaphragm 222 into the chamber 230. That is, in response to a force on the contact surface 224 of the diaphragm 222, the diaphragm 222 may be resiliently flexible relative to the housing 221 and the support 226 to bias the contact surface 224 in a direction away from the chamber 230 and, thus, into contact with the heat-dissipating components 104a,b. As compared to a non-flexible interface with a heat-dissipating component, the resilient flexibility of the diaphragm 222 to bias the contact surface 224 into contact with the heat-dissipating components 104a,b may result in fewer (or smaller) air gaps and, thus, less thermal resistance along a thermal path from the heat-dissipating components 104a,b into the chamber 230. Additionally, or alternatively, as described in greater detail below, at least a portion of the wick 228 may be between the support 226 and the diaphragm 222 such that the wick 228 in the chamber 230 may flex to sustain performance of an evaporation/condensation cooling loop in the chamber 230, even as the diaphragm 222 resiliently flexes to facilitate establishing tight contact with heat-generating components along the contact surface 224.

To facilitate efficient heat transfer through the thermal management device 220, it shall be appreciated that any one or more of the housing 221, the diaphragm 222, or the wick 228 may be at least partially formed of one or more metals. Given that use of fluid cooling in the thermal management device 220, the one or more metals may include metals compatible with the fluid in the chamber 230. In this context, compatibility between the one or more metals and the fluid shall be understood to include a resistance to corrosion or other type of degradation in the presence of the fluid. Given its high thermal conductivity and compatibility across a wide range of common fluids, copper may be a particularly useful metal for forming at least a portion of one or more of the housing 221, the diaphragm 222, or the wick 228. Further, or instead, while a single metal may be used in a given element, it shall be appreciated that each element may be at least partially formed of a plurality of metals, as may be useful for achieving dimensional and/or cost constraints associated with a given application. As an example, the housing 221 may be formed of a first metal along the chamber 230 to promote heat transfer while being formed of a second metal along an outer portion of the housing 221 to achieve strength requirements. More generally, given that an intended use of the thermal management device 220 is to achieve efficient heat transfer, it shall be appreciated that any one or more of the components of the thermal management device 220 described herein may be at least partially formed of one or more metals, unless otherwise specified or made clear from the context.

The housing 221 may generally include a first section 231 and a second section 232 spaced apart from one another by at least a portion of the chamber 230. The first section 331 may be a condenser. Additionally, or alternatively, the second section 232 may be an evaporator. Thus, in operation of the thermal management device 220 as a heat pipe, a fluid may evaporate in the chamber 230 along the second section 232 and condense into a liquid in the chamber 230 along the first section 231. As described in greater detail below, the wick 228 may move the liquid, through capillary action, from the first section 231 of the housing 221 to the second section 232 of the housing 221 such that the evaporation and condensation cycle may be repeated to continually cool the heat-dissipating components in contact with the diaphragm 222 along the contact surface 224.

Given that the first section 231 and the second section 232 of the housing 221 must be spaced apart by at least a portion of the chamber 230 for proper operation of the thermal management device 220 as a heat pipe, the first section 231 and the second section 232 may each be rigid. In this context, rigidity shall be understood to be in comparison to the diaphragm 222. Given this rigidity, it shall be appreciated that the first section 231 and the second section 232 of the housing may be used to support the diaphragm 222. For example, the diaphragm 222 may be supported along the second section 232 of the housing 221 such that heat entering the chamber 230 via the contact surface 224 of the diaphragm 222 may be efficiently introduced into a liquid state of the fluid in the chamber 230 to heat the fluid to an evaporated state. Continuing with this example, the support 226 may extend from the first section 231 of the housing 221 toward the diaphragm 222 to support the diaphragm 222 relative to the chamber 230. That is, the first section 231 of the housing 221 may provide a backstop for the support 226 such that the support 226 resists movement of the diaphragm 222 into the chamber 230. In doing so, the support 226 may reduce the likelihood of inadvertently collapsing the diaphragm 222 into the chamber 230 in response to force of the heat-dissipating components 104*a,b* on the contact surface 224 of the diaphragm 222. As described in greater detail below, the support 226 may be elastically deformable to allow the diaphragm 222 to flex into the chamber 230 by a small amount, with the resulting compliance of the diaphragm 222 accommodating differences in geometry between the heat-dissipating components 104*a,b*.

In certain implementations, one or more of the first section 231 or the second section 232 may have a substantially planar outer surface. In this context, substantially planar shall be understood to refer to a surface having a surface area that is mostly flat, allowing for small variations within manufacturing tolerance. For example, the first section 231 may include a first substantially planar surface 233 to facilitate mounting any one or more of the various different heat exchangers described herein to the first section 231 and, in turn, facilitate maintaining a temperature differential between the first section 231 and the second section 232 of the housing 221. Further, or instead, the second section 232 of the housing 221 may include a second substantially planar surface 234 to facilitate manufacturability. As an example, as compared to other shapes, the second substantially planar surface 234 may be more easily located relative to the printed circuit board 102 and/or relative to the heat-dissipating components 104*a,b*. For example, the diaphragm 222 may be coupled to the second substantially planar surface of the second section 232 of the housing 221, and the contact surface 224 of the diaphragm 222 may be spaced apart from a plane defined by the second substantially planar surface 234. Such spacing may be useful for, among other things, accurately placing the contact surface 224 in contact with the heat-dissipating components 104*a,b* with a reduced likelihood of inadvertent contact with the second section 232 of the housing 221.

In general, the diaphragm 222 may have generally rounded features in the absence of an external force on the contact surface 224, and the contact surface 224 itself may change shape in response to an external force. At least because the rounded features of the diaphragm do not have high stress concentrations and changing the shape of the contact surface 224 of the diaphragm to accommodate the heat-dissipating components 104*a,b* does not require the use of joints, the diaphragm 222 may be particularly durable and robust through prolonged use. For example, as compared to flexing arrangements including bellows, the flexible shape of the diaphragm 222 itself along the contact surface 224 has fewer points of stress concentration prone to failure resulting from repeated cycling of force. Further, or instead, the flexible shape of the diaphragm 222 may facilitate achieving a high degree of stiffness that is typically not achievable using flexing arrangements, such as bellows, that include joints.

The diaphragm 222 may be secured to the housing 221 according to any one or more of various different techniques compatible with the shape, size, and composition of the diaphragm 222 and the shape, size, and composition of at least the second section 232 of the housing 221. More specifically, the diaphragm 222 and the second section 232 of the housing 221 may be secured in sealed engagement with one another to reduce the need for additional sealing components that may, ultimately, impact durability of the thermal management device 220. Thus, in some instances, the diaphragm 222 may be secured to the second section 232 of the housing 221 using techniques including any one or more of various different forms of welding, brazing, soldering, diffusion bonding, coining, or combinations thereof. Further, or instead, in instances in which the diaphragm 222 includes a metallic (e.g., copper) foil, the diaphragm 222 may be secured to the housing 221 using one or more adhesives (e.g., a UV curable adhesive).

In some instances, the diaphragm 222 may be a unitary piece. This may be useful, for example, for forming the diaphragm 222 using stamping or another similar process. Further, or instead, forming the diaphragm 222 as a unitary piece may facilitate securing the diaphragm 222 independent of orientation. While the diaphragm 222 may be formed as a unitary piece having consistent properties throughout, the diaphragm 222 may alternatively be formed from a plurality of pieces. Such formation of the diaphragm 222 from a plurality of pieces may facilitate, for example, decoupling a flexibility profile of the diaphragm 222 from heat transfer properties of the diaphragm 222, as may be useful for achieving more efficient heat transfer compared to the use of a single piece formed of a single material.

As the interface with the heat-dissipating components 104*a,b*, the contact surface 224 of the diaphragm 222 may be any one or more of various different shapes useful for substantially conforming to the shape of the heat-dissipating components 104*a,b* with few, if any, air gaps therebetween. In implementations in which the heat-dissipating components 104*a,b* are similarly sized (e.g., with variations in size related to manufacturing tolerances, differences in thermal expansion, or combinations thereof), the contact surface 224 may advantageously be substantially planar in the absence of an outside force applied to the contact surface 224 and have a periphery sized for engagement with a heat-dissipating component. In this context, substantial planarity of the contact surface 224 shall be understood to include a surface deviating from ideal planarity according to normal manufacturing tolerances. Continuing with this example, the contact surface 224 having a substantially planar form factor may be useful for approximately uniform initial engagement with flat surfaces of the heat-dissipating components 104*a,b*, while flexibility of the contact surface 224 facilitate fine deviations from substantial planarity to conform the contact surface 224 to the heat-dissipating components 104*a,b*.

In general, the support 226 balances the challenge of providing a high degree of stiffness to the diaphragm 222 while also being compatible with physical constraints associated with being positioned within the chamber 230. That is, because the overall dimensions available within the chamber 230 are typically small for most circuit pack applications, the support 226 may advantageously provide a high degree of stiffness within a small size envelope compatible with the dimensions of the chamber 230. Further, because the support 226 displaces a volume of fluid that would otherwise be used in the evaporation/condensation loop within the chamber 230, the support 226 may advantageously provide a high degree of stiffness within a small volume.

As a specific and particularly useful implementation for balancing the disparate requirements of stiffness and size/volume within the chamber 230, the support 226 may be a monolithic shape (e.g., a cylindrical plug) having high elasticity. Advantageously, the stiffness of the monolithic shape having high elasticity is a result of the stiffness of the material itself. That is, as compared to a coil or another type of spring, the stiffness of such a monolithic shape with high elasticity does not require a specific geometry, beyond being wide enough to avoid buckling under typical forces exerted on the support 226 during normal use. Further, or instead, as compared to many types of springs, the monolithic shape is easy to manufacture, with little or no need for specialized equipment. As an example, support 226 formed as a monolithic shape may have an elastic modulus of greater than about 0.2 MPa and less than about 700 MPa (e.g., greater than about 0.3 MPa and less than about 50 MPa). The support 226 formed as a monolithic shape of a material having an elastic modulus within this range is particularly advantageous for providing sufficient stiffness within an efficient size envelope. As a more specific example, the support 226 may include one or more polymeric materials, examples of which include natural rubber, ethylene propylene diene monomer rubber (EPDM), neoprene, nitrile rubber, polyurethane rubber, fluoroelastomer, silicone rubber, butadiene rubber, styrene-butadiene rubber (SBR), chlorobutyl rubber, poly(ethylene-propylene) (EPM), hydrogenated nitrile rubber, epichlorohydrin homopolymer, epichlorohydrin copolymer, or combinations thereof. Further, or instead, the support 226 may include one or more aerogels having a predetermined elasticity and, in some cases, a material as solid skeleton.

In general, the wick 228 may be any one or more of various different types of wicks useful for moving a liquid state of a fluid from the first section 231 (the condenser section) to the second section 232 (the evaporator section) of the housing 221 as the thermal management device 220 operates as a heat pipe. For example, any one or more portions of the wick 228 may include one or more of a sintered material, a screen, a wire bundle, a grooved surface, or a combination thereof. Further, or instead, the wick 228 may have a pore size and/or particle size (in the case of sintered material) that facilitates meeting performance limits over a predetermined temperature range without being compromised by the capillary limit, boiling limit, entrainment limit, sonic limit, etc. Further, or instead, the support 226 or another similar structure in the chamber 230 may act as an artery to support the diaphragm 222 from collapsing at lower temperatures when the vapor pressure of the fluid in the chamber 230 is lower than during operation when the heat-dissipating 104a,b components are powered.

The wick 228 may, for example, include a first portion 236 and a second portion 238. In certain instances, the first portion 236 and the second portion 238 of the wick may be continuous from the first section 231 to the second section 232 of the housing 221. Further, or instead, the wick 228 may include discrete sections that are not directly coupled to one another but, nevertheless, form a continuous flow path of fluid moving along the wick 228, through capillary action, from the first section 231 to the second section 232 of the housing 221.

The first portion 236 of the wick 228 may be in contact with the housing 221, such as may be useful for facilitating conductive heat transfer from the first substantially planar surface 233 of the housing 221 to the first portion 236 of the wick 228 in the chamber 230. More specifically, the first portion 236 of the wick 228 may extend along an inner surface 240 of the first section 231 of the housing 221 to facilitate maintaining the first portion 236 along the first section 231 of the housing 221 at a temperature useful for condensing the fluid in the wick 228. In certain implementations, contact between the first portion 236 of the wick 228 may include coupling the first portion 236 of the wick 228 to the first section 231 of the housing. Such coupling may include, but is not limited to, spot welding, sintering, diffusion bonding, or a combination thereof.

The second portion 238 of the wick 228 may be disposed in the chamber 230, between the support 226 and the diaphragm 222. So positioned, the second portion 238 of the wick 228 may facilitate delivering fluid in a liquid phase to the second section 232 of the housing 221 and/or to the diaphragm 222, where the liquid phase of the fluid may evaporate to cool the second section 232 of the housing 221 and/or the diaphragm 222, as the case may be. With the heat-dissipating components 104a,b in contact with the contact surface 224 of the diaphragm 222, it shall be understood that such cooling of the diaphragm 222 imparts cooling to the heat-dissipating components 104a,b via thermal conduction through the diaphragm 222.

At least a segment of the second portion 238 of the wick 228 may change shape along with resilient flexing of the diaphragm 222 while the first portion 236 of the wick 228 retains a constant shape in the chamber 230. For example, the resilient flexibility of the diaphragm 222 may change a shape of the second portion 238 of the wick 228 in the chamber 230 at least along the diaphragm 222. That is, as the diaphragm 222 flexes into the chamber 230 in response to the force of the heat-dissipating components 104a,b on the contact surface 224, the second portion 238 of the wick 228 along the diaphragm 222 may undergo a corresponding amount of flexing to accommodate the change in shape of the diaphragm 222 while remaining near, if not in direct contact, with the diaphragm 222.

In some implementations, the thermal management device 220 may include one or more instances of a core 242 (referred to hereinafter as the core 242) extending from the first section 231 to the second section 232 of the housing 221. For example, the core 242 may extend from the first section 231 to the second section 232 of the housing 221 such that an axis defined by the core 242 extends through second portion 238 of the wick 228 along the diaphragm 222. The core 242 may, for example, provide support for the second portion 238 of the wick 228 as the second portion 238 of the wick 228 changes shape in response to resilient flexing of the diaphragm 222.

The core 242 may, for example, be coupled and/or integrally formed with the inner surface 240 of the first section 231 of the housing. Continuing with this example, the core 242 may be at least partially formed of one or more materials having a high thermal conductivity (e.g., one or more metals). Thus, as the first section 231 of the housing is cooled, conductive heat transfer along the core 242 may cool a portion of the chamber away from the inner surface 240 of the first section 231 of the housing. Such cooling may be useful for driving the evaporation/condensation cycle of the fluid in the chamber 230.

In certain implementations, the first portion 236 of the wick 228 may be in contact with the core 242 at least along the inner surface 240 of the first section 231 of the housing 221. Thus, to the extent liquid condenses on the core 242, such liquid may be collected in the first portion 236 of the wick 228. In some cases, the first portion 236 of the wick 228 may extend along the core 242 from the first section 231 of the housing 221 toward the second portion 238 of the wick 228 supported along the diaphragm 222. As a more specific example, the first portion 236 of the wick 228 may circumscribe the core 242 and extend along the core 242 from the first section 231 of the housing 221 toward the second portion 238 of the wick 228 supported along the diaphragm 222, as may be useful for providing structural support to the first portion 236 of the wick 228. In turn, such structural support of the first portion 236 of the wick 228 may be useful for maintaining a robust fluid flow path from the first portion 236 to the second portion 238 of the wick 228, even as the second portion 238 of the wick 228 changes shape in response to resilient flexing of the diaphragm 222.

Figure 3:
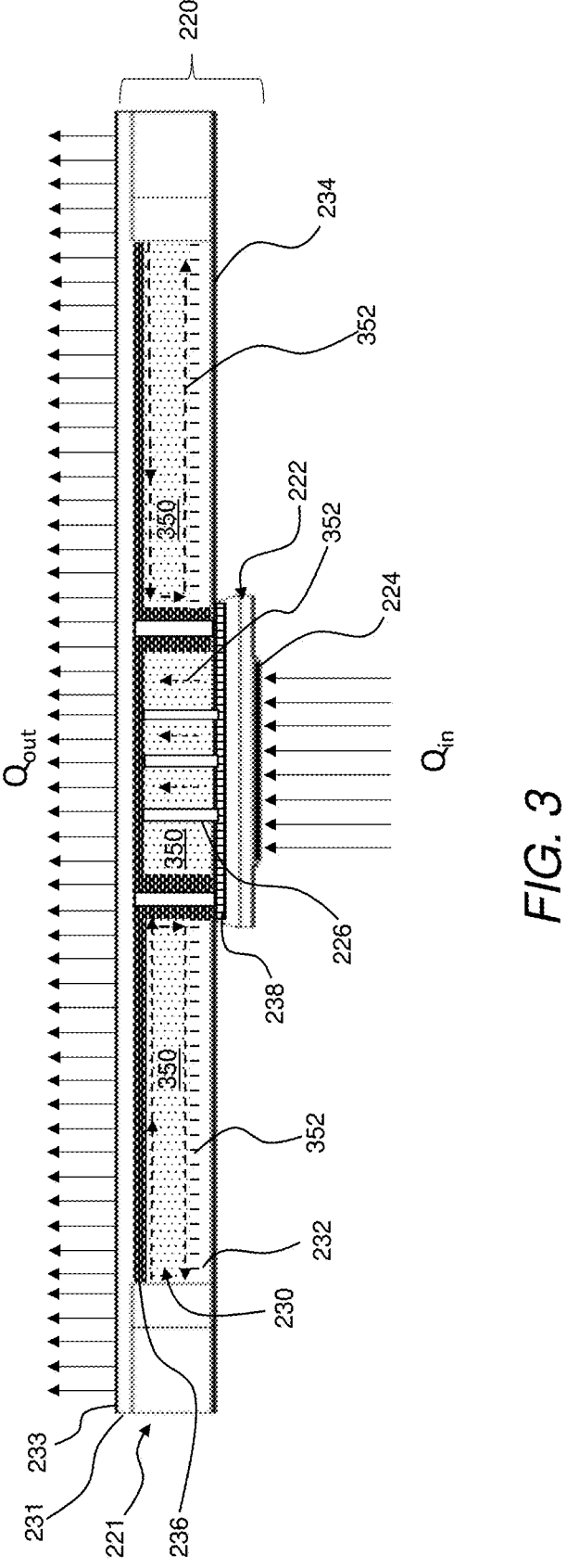
FIG. 3 is a schematic representation of evaporation and condensation of a fluid in the thermal management device of the system of FIG. 1.

FIG. 3 is a schematic representation of the evaporation/ condensing cycle of the thermal management device 220 in operation as a heat pipe to cool heat-dissipating components (e.g., the heat-dissipating components 104a,b in FIG. 1). The thermal management device 220 may include a fluid 350 sealed in the chamber 230. It shall be appreciated that the fluid 350 is not shown in the other figures to facilitate identification and description of other features of the thermal management device 220. However, unless otherwise specified or made clear from the context, the fluid 350 shall be understood to present in the chamber 230 of any one or more of the various different thermal management devices described herein.

The fluid 350 may include any one or more of various different fluids suitable for vaporizing and condensing in a temperature range associated with a particular application, including applications ranging from cryogenic conditions to high temperature conditions. Thus, in general, the fluid may have a vaporization temperature greater than about −271° C. and less than about 2025° C. (e.g., greater than about −150° C. and less than about 300° C.). Examples of the fluid include, but are not limited to, one or more nitrogen, alcohol (e.g., ethanol), water, or sodium. In certain implementations, the fluid 350 may be a single fluid species in the chamber 230.

In general, the fluid 350 may be disposed in the chamber 230 in fluid communication with the first portion 236 and the second portion 238 of the wick 228. More specifically, input heat $Q_{in}$ generated by heat-dissipating devices (e.g., the heat dissipating components 104a,b) may move into the chamber 230 via the contact surface 224 of the diaphragm. With the second portion 238 of the wick 228 in contact with, or at least near, the diaphragm 222, the input heat $Q_{in}$ may come into contact with a liquid state of the fluid 350 in the second portion 238 of the wick 228. At least a portion of the input heat $Q_{in}$ may be absorbed by the fluid 350 in the second portion 238 of the wick 228 to vaporize the liquid state of the fluid 350 into a vapor state that may move (e.g., rise) along a vapor flow path 352 to move in an overall direction from the second portion 238 of the wick 228 toward the first portion 236 of the wick 228 along the first section 231 of the housing 221.

The first section 231 of the housing 221 may be actively cooled according to any one or more of the various different techniques described herein and/or passively cooled to remove output heat $Q_{out}$ from the chamber 230. Through removal of the output heat $Q_{out}$ via cooling of the first section 231 of the housing 221, the first section 231 of the housing 221 may be at a temperature below a condensation temperature of the fluid 250 in the chamber 230. With the first portion 236 of the wick 228 along the first section 231 of the housing 221, the first portion 236 of the wick 228 may also be below the condensation temperature of the fluid 350 such that the vapor phase of the fluid 250 may condense along any one or more portions of the first portion 236 of the wick 228.

Through capillary action in the wick 228, the liquid phase of the fluid 350 may move along a liquid path 354 from the first portion 236 of the wick 228 along the first section 231 of the housing 221 to the second portion 238 of the wick 228 at least along the diaphragm 222. In certain implementations, the second portion 238 of the wick 228 may further extend along all or a portion of the second portion 238 of the housing 221, as may be useful for providing a larger heat transfer surface area to facilitate cooling the diaphragm 222.

With the liquid state of the fluid 350 in the second portion 238 of the housing 221, the evaporation/condensation cycle may repeat. It shall be appreciated that, while the evaporation/condensation cycle has been described as a sequence of steps, the process may be continuous such that the fluid 350 is continually evaporating and condensing to cool the heat-dissipating components along the diaphragm 222. As compared to the use of thermal grease or other types of filler material, the resilient flexibility of the diaphragm 222 for improved engagement with heat-dissipating components may reduce the overall thermal resistance of the thermal management device 220 such that the thermal management device 220 may remove heat more efficiently.

FIGS. 4A-4H show an exemplary method of fabricating a thermal management device. Unless otherwise specified or made clear from the context, the exemplary method shown in FIGS. 4A-4H shall be understood to be applicable to forming any one or more of the various different thermal management devices described herein and, thus, shall be generally understood to be applicable to the fabrication of the thermal management device 220 (FIG. 1A and FIGS. 2A-2D).

Figure 2A:
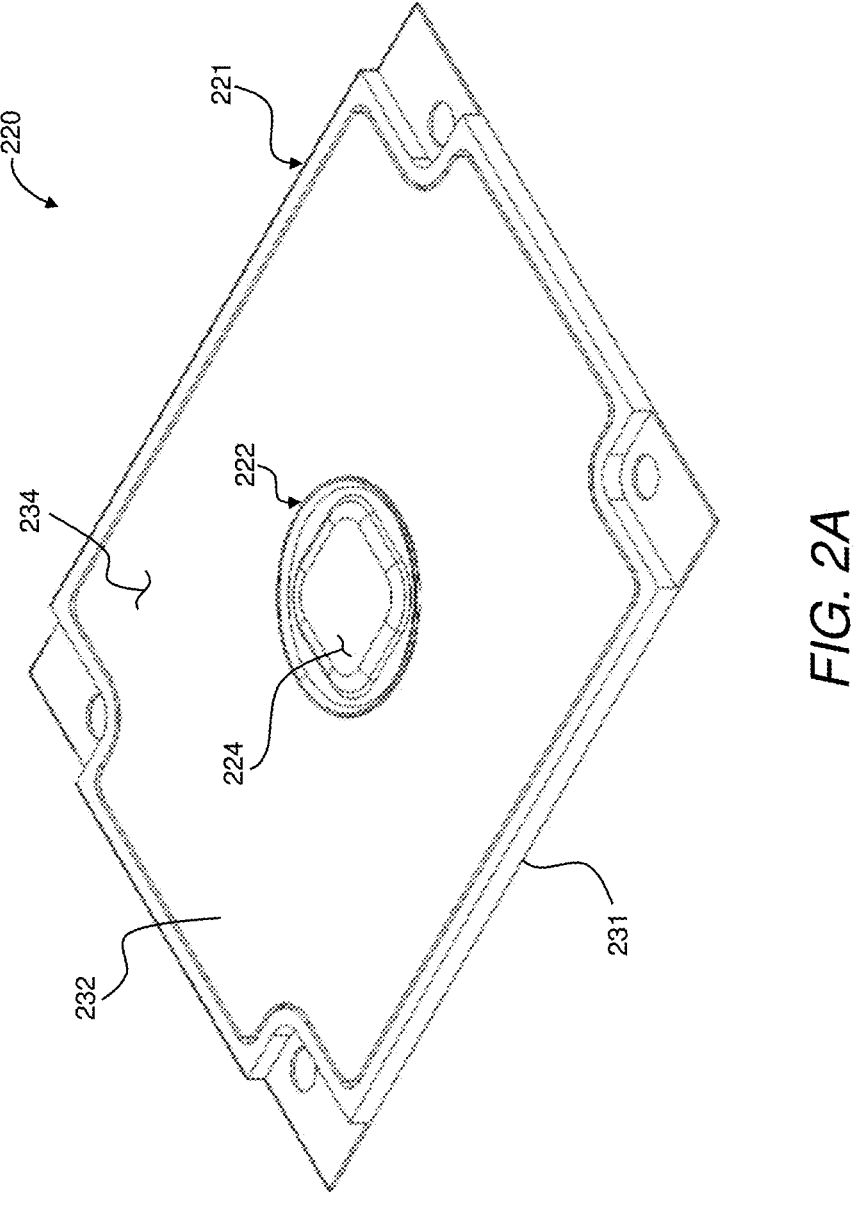
FIG. 2A is a perspective view of the thermal management device of the system of FIG. 1.
Figure 2B:
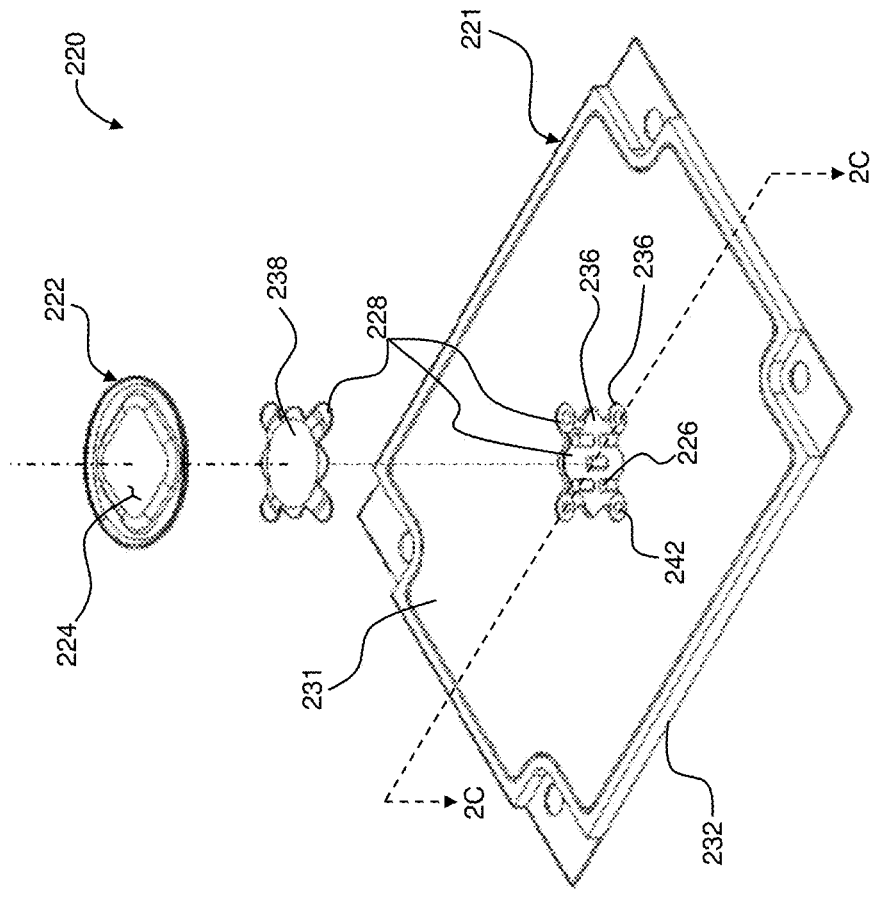
FIG. 2B is a partially exploded perspective of the thermal management device of FIG. 2A.
Figure 2C:
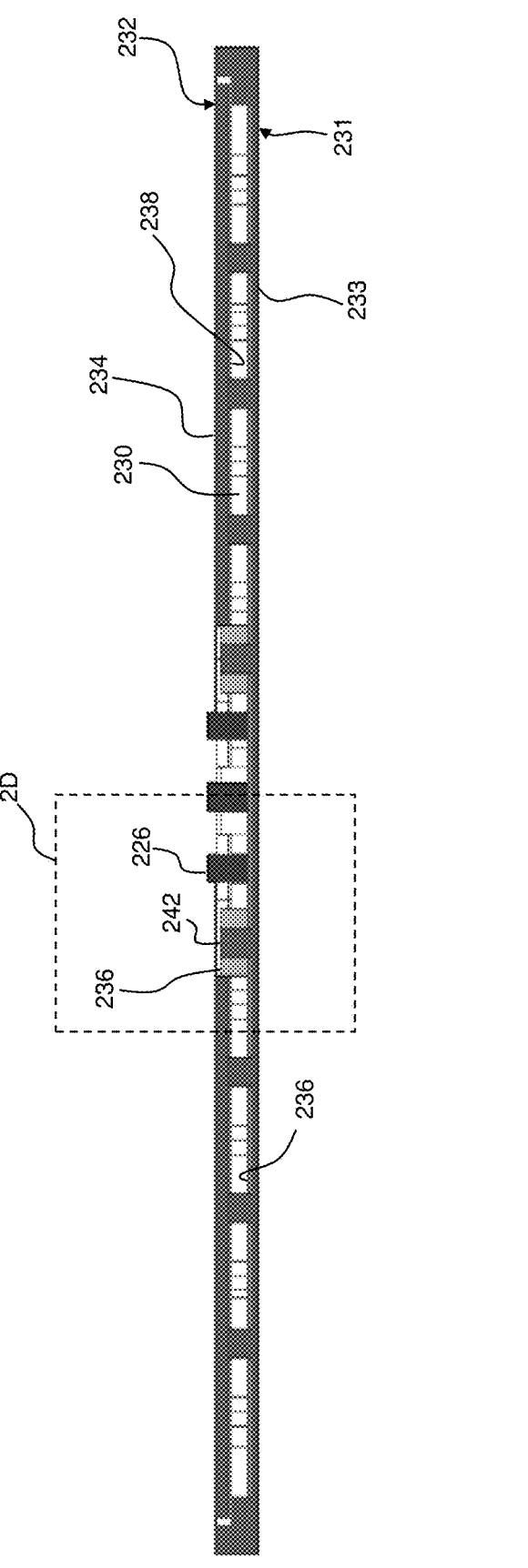
FIG. 2C is a side view of a cross-section of a portion of the thermal management device of FIG. 2A, the cross-section taken along the line 2C-2C in FIG. 2B.
Figure 2D:
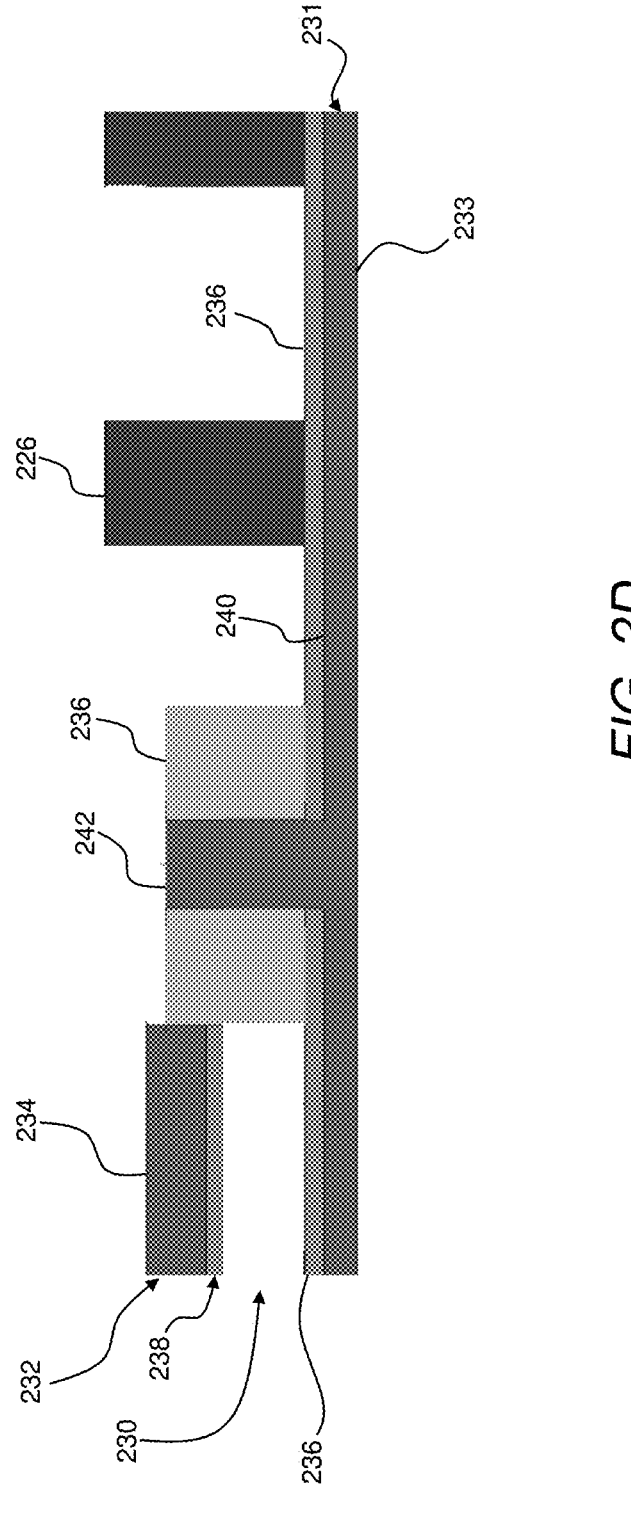
FIG. 2D is a side view of the area of detail 2D in FIG. 2C.
Figure 4B:
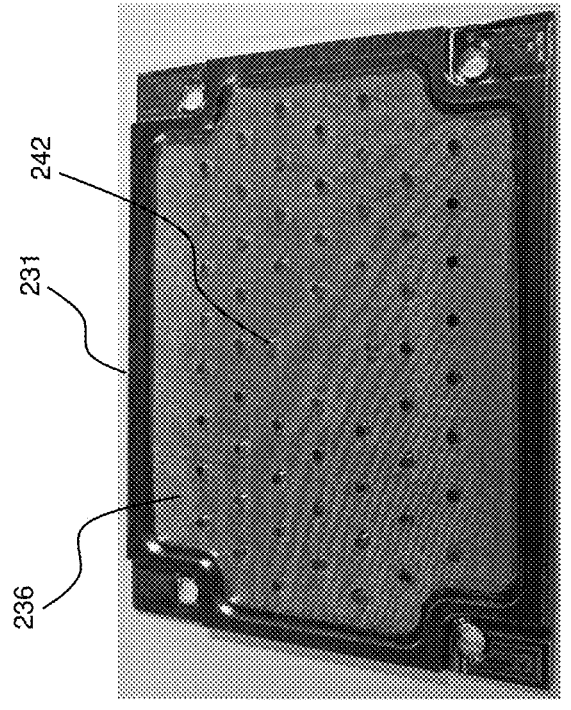
FIGS. 4A-4H are, collectively, a schematic representation of a method of fabricating a thermal management device.
Figure 4A:
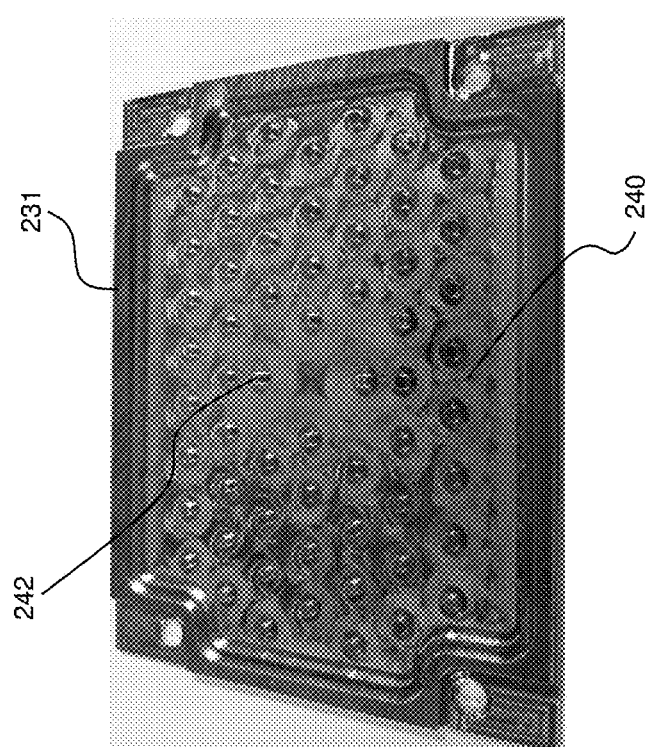
Figure 4D:
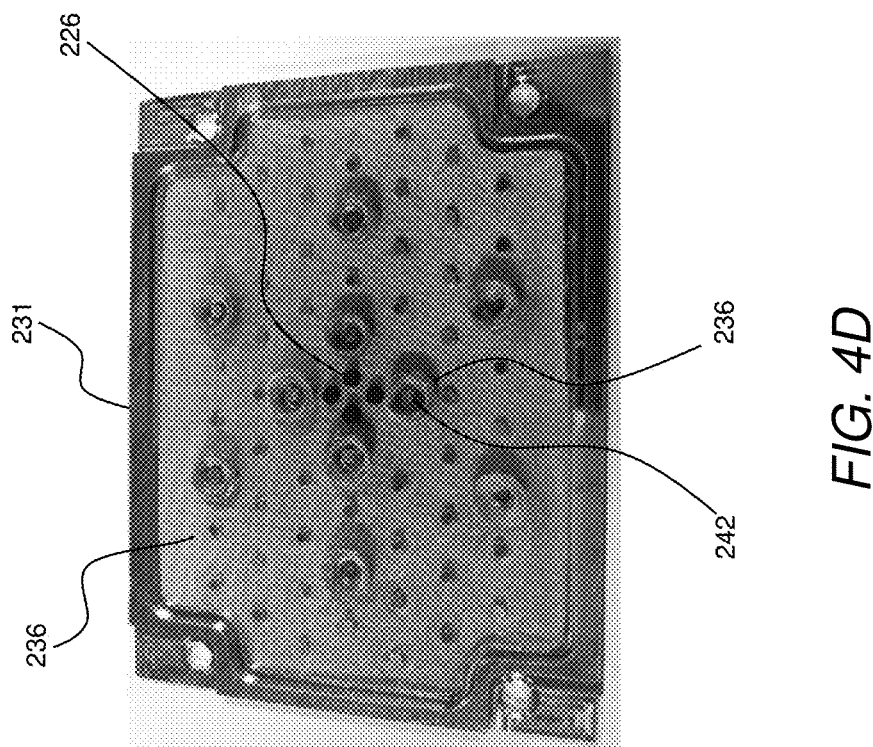
Figure 4C:
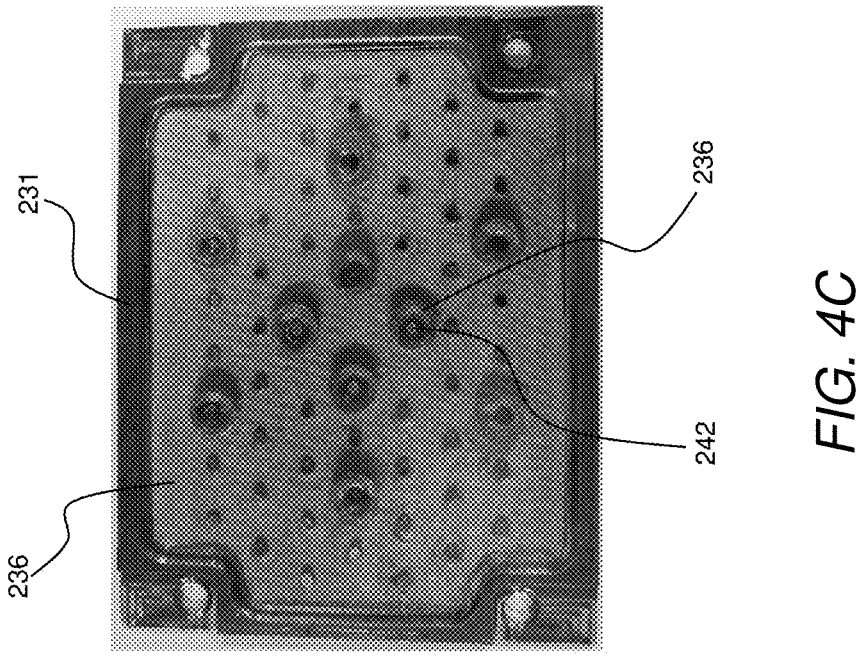
Figure 4F:
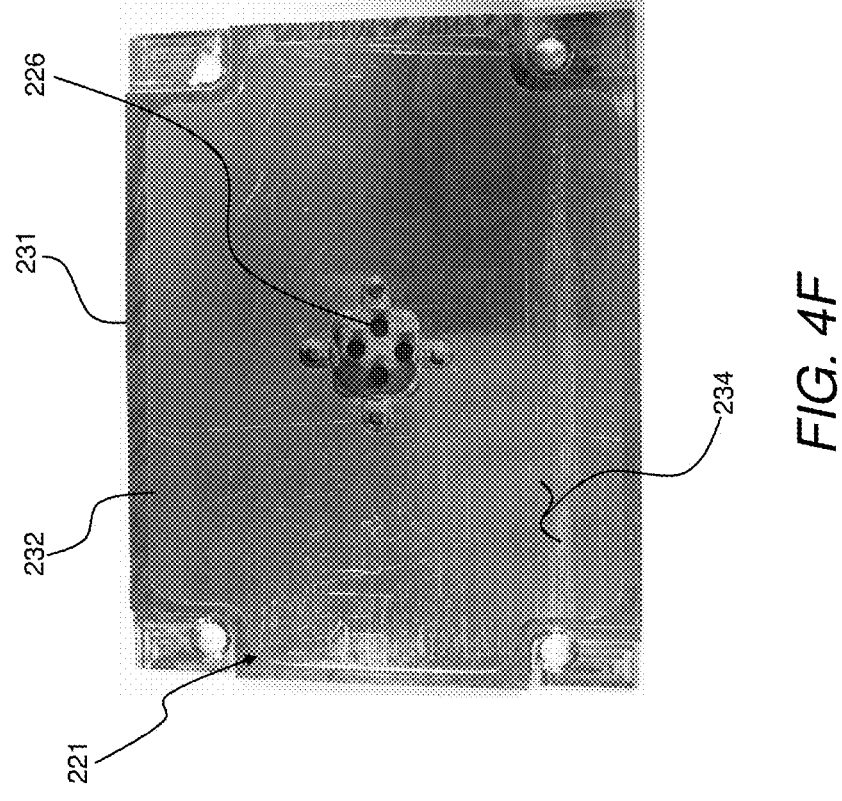
Figure 4E:
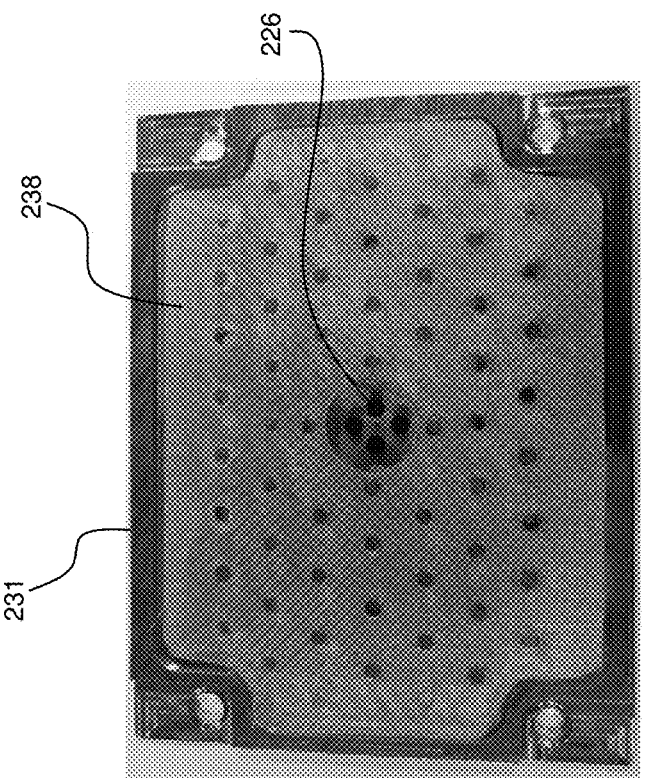
Figure 4H:
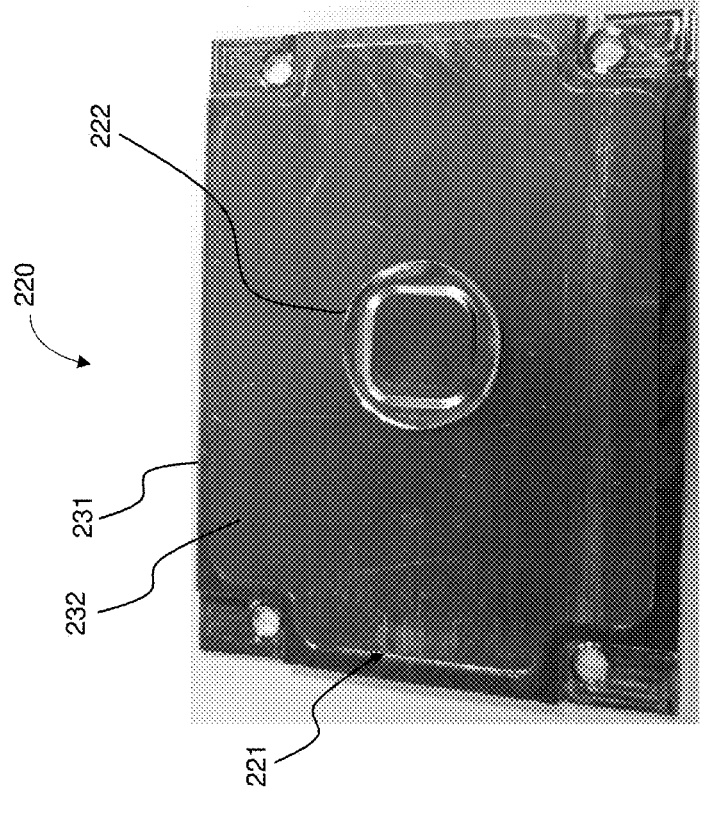
Figure 4G:
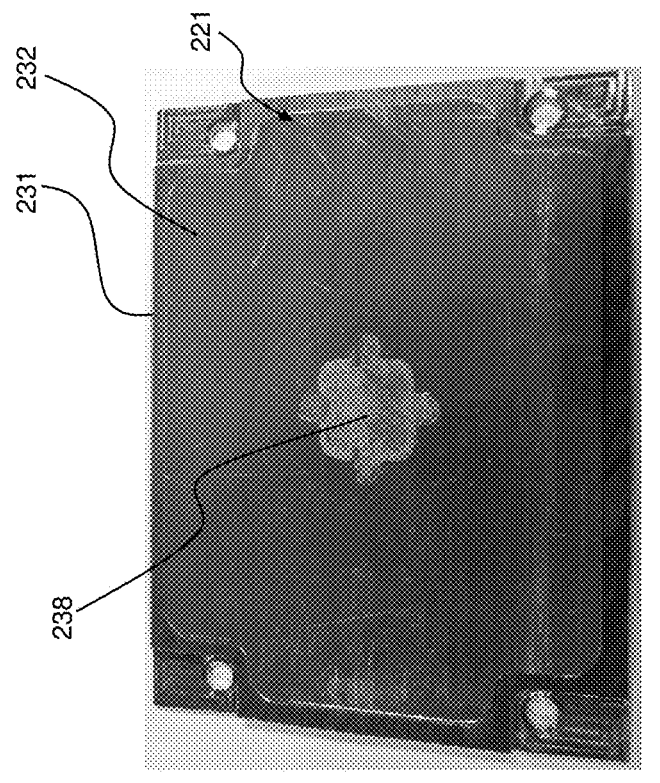

Referring now to FIGS. 4A-4C, an exemplary method of fabrication of thermal management device may include positioning the first portion 236 of the wick 228 in contact with a housing (e.g., with the first section 231 of the housing 221 (FIG. 1)). This may include, for example, covering the inner surface 240 of the first section 231 of the housing 221 (FIG. 1) with the first portion 236 of the wick 228 (FIG. 2B). Further, or instead, positioning the first portion 236 of the wick 228 (FIG. 2B) in contact with the first section 231 of the housing 221 (FIG. 1) may include securing the first portion 236 of the wick 228 (FIG. 2B) to the inner surface 240 using sintering, spot welding, and/or diffusion bonding. In certain implementations, positioning the first portion 236 of the wick 228 (FIG. 2B) in contact with the housing may include positioning the first portion 236 of the wick 228 (FIG. 2B) along the core 242 such that the first portion 236 of the wick 228 (FIG. 2B) extends in a direction away from the inner surface 240.

Referring now to FIGS. 4D-4H, the exemplary method of fabrication may include installing the support 226 on a surface of the housing (e.g., along the inner surface 240 of the first section 231 of the housing 221 (FIG. 1)). In particular, a plurality of instances of the support 226 may be positioned substantially evenly apart from one another to provide even support along the diaphragm 222.

Referring now to FIGS. 4E-4H, the exemplary method of fabrication may include positioning the second portion 238 of the wick 228 (FIG. 2B) between the support 226 and the diaphragm 222. For example, the second portion 238 of the wick 228 (FIG. 2B) may include a rigid segment positioned along the second section 232 of the housing 221 while a segment of the second portion 238 of the wick 228 beneath the diaphragm 222 may be flexible to move with the resilient flexing of the diaphragm 222.

Further, or instead, the exemplary method of fabrication may include enveloping the first portion 236 (FIG. 4B) and the second portion 238 of the wick 228 (FIG. 2B) and the support 226 in the chamber 230 defined by the housing 221 and the diaphragm 222. For example, enveloping may include forming a fluid tight seal (e.g., using diffusion bonding, welding, brazing, soldering, an adhesive, or a combination thereof) between the diaphragm 222 and the second section 232 of the housing 221. Further, or instead, enveloping may include forming a single fluid species environment in the chamber 230.

While certain implementations have been described, it shall be appreciated that other implementations are additionally or alternatively possible.

For example, while thermal management devices have been described as including substantially planar surfaces, it shall be appreciated that thermal management devices of the present disclosure may include other types of surfaces. For example, in some instances, a thermal management device may be securable to a heat-receiving structure (e.g., a heat exchanger) along a surface that is not substantially planar (e.g., due to geometric constraints). Accordingly, in such instances, a housing of the thermal management device may include one or more surfaces shaped to mate appropriately with the shape of the heat-receiving structure.

As another example, while thermal management devices have been described as being vapor chambers with a diaphragm compliable under pressure of being mounted to one or more heat-dissipating devices, it shall be appreciated that other types of thermal management devices are additionally, or alternatively, possible for compliant engagement with one or more heat-dissipating devices. As described in greater detail below, a thermal management device may be a cooling plate including a diaphragm compliant in response to pressure on a contact surface when mounted to a one or more heat-dissipating components. In general, the compliance of the diaphragm of the cooling plate may advantageously move one or more fins relative to a housing of the cooling plate to define channels through which a cooling fluid may be moved to carry heat away from the one or more heat-dissipating components mounted to the cooling plate. In the examples that follow, cooling plates are described in the context of a single heat-dissipating component on a printed circuit board. It shall be appreciated that this is for the sake of clear and efficient explanation and that, unless otherwise specified or made clear from the context, cooling plates described below may include any number and arrangement of diaphragms and, thus, may be mounted to any number and arrangement of corresponding heat-dissipating components.

Figure 5A:
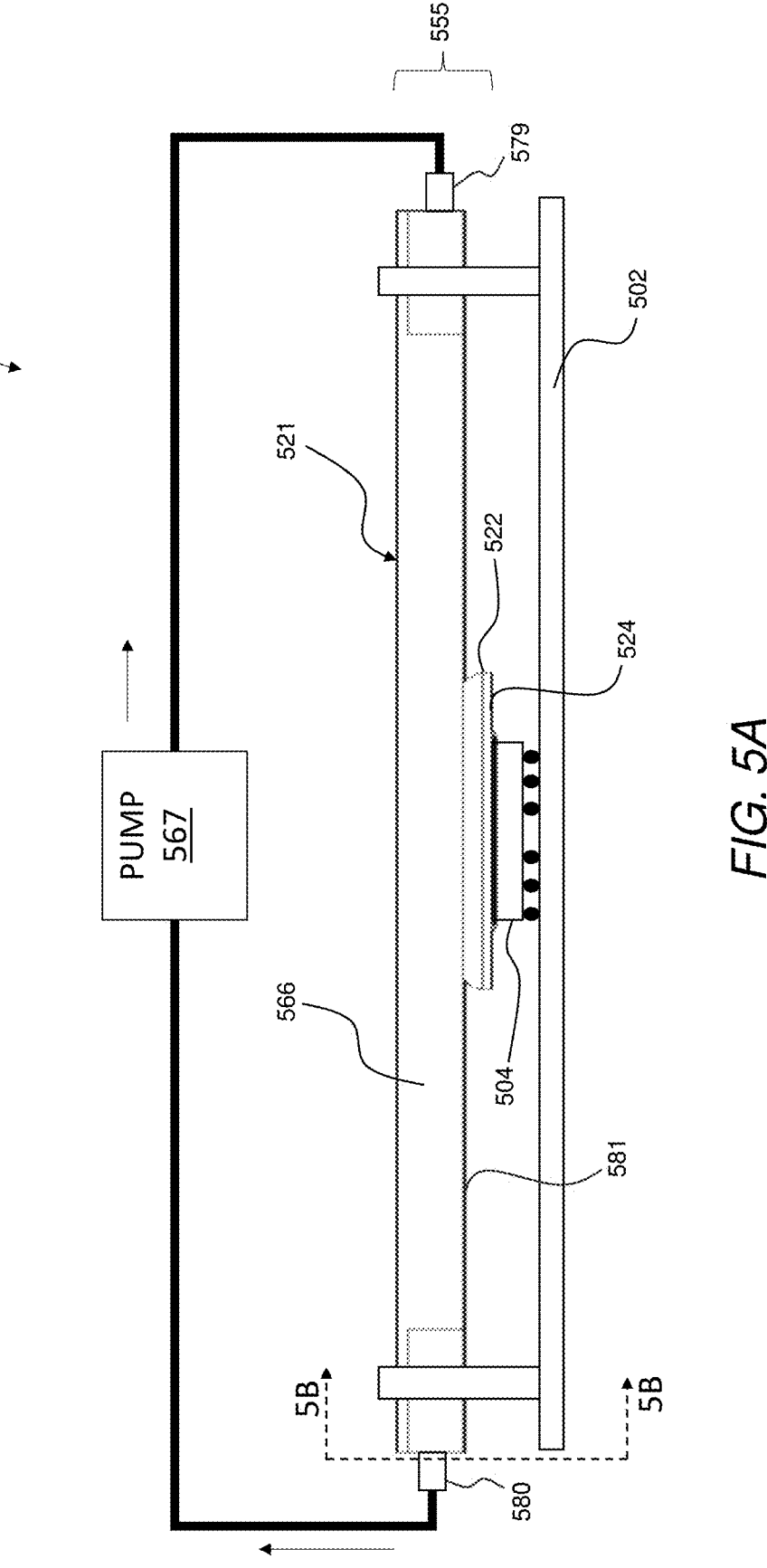
FIG. 5A is a schematic representation of a circuit pack including a cooling plate attached to a heat-dissipating component mounted on a printed circuit board.
Figure 5B:
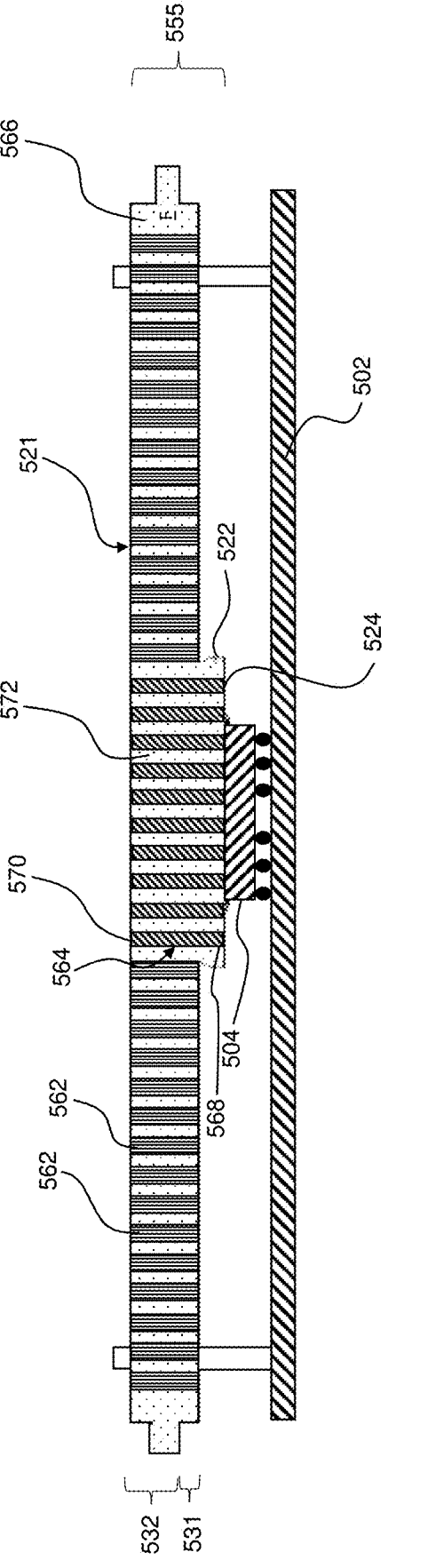
FIG. 5B is a side view of a cross-section of a portion of the circuit pack of FIG. 5A, the cross-section taken along line 5B-5B in FIG. 5A, and the cooling plate shown with fins shown in a compressed orientation relative to a housing of the cooling plate in response to pressure of the heat-dissipating component on a contact surface of a diaphragm of the cooling plate.
Figure 5C:
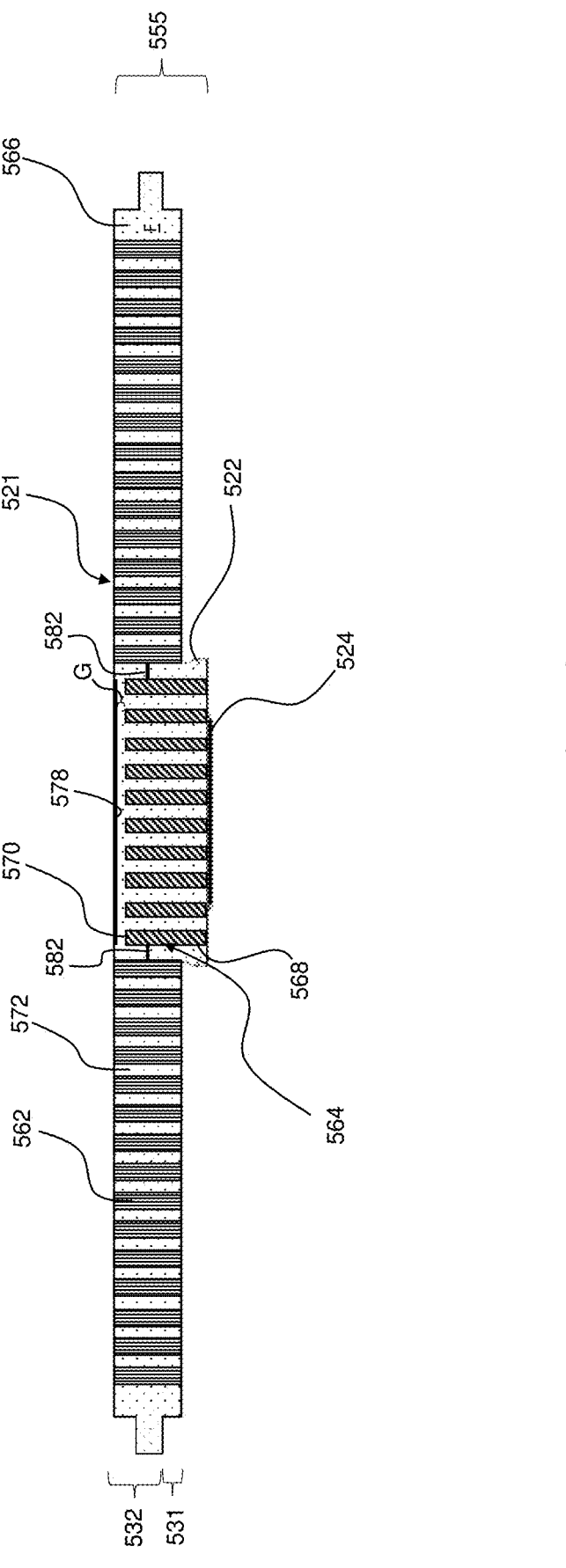
FIG. 5C is a side view of the cross-section of the cooling plate of FIG. 5B, shown with the heat-dissipating component removed and the fins in a relaxed orientation in the absence of pressure of the heat-dissipating component on the contact surface of a diaphragm of the cooling plate.

Referring now to FIGS. 5A-5C, a circuit pack 500 may include a printed circuit board 502, at least one instance of a heat-dissipating component 504, and a cooling plate 555. The heat-dissipating component 504 may be coupled to the printed circuit board 502, and the heat-dissipating component 504 may be in contact with a contact surface 524 of a diaphragm 522 of the cooling plate 555. In this context, it shall be appreciated that contact between the cooling plate 555 and the heat-dissipating component 504 may include direct contact and/or indirect contact via a thin layer of thermal grease or other similar, thermally conductive material. For the sake of clear and efficient description, 100-series, 200-series, and 300-series elements describing aspects of the circuit pack 500 and having the same last two digits as 500-series element numbers in the portion of the description that follows shall be understood to be analogous to or interchangeable with one another, unless otherwise explicitly made clear from the context and, therefore, are not described separately from one another, except to note differences or to emphasize certain features. As described in greater detail below, the cooling plate 555 may include at least one fin movable toward the housing of the cooling plate 555 in response to pressure of the heat-dissipating component 504 on the contact surface of the diaphragm 522.

In general, the cooling plate 555 may include the diaphragm 522, a housing 521, a plurality of ribs 562, and at least one instance of a fin 564. The housing 521 may support the diaphragm 522. As an example, the diaphragm 522 and the housing 521 may collectively define a chamber 566 enclosed relative to the contact surface 524 of the diaphragm 522, and the plurality of ribs 562 may be disposed in the chamber 566. Each instance of the fin 564 may include a first end portion 568 and a second end portion 570, with the first end portion 568 coupled to the diaphragm 522 and the second end portion 570 in the chamber 566. In the absence of external pressure on the contact surface 524 of the diaphragm 522, the second end portion 570 of the at least one instance of the fin 564 and the housing 521 may define a gap G therebetween, and the second end portion 570 of the at least one instance of the fin 564 may be movable toward the housing 521 in response to the external pressure on the contact surface 524 of the diaphragm 522.

Additionally, or alternatively, the at least one instance of the fin 564 and the plurality of ribs 562 may collectively define a plurality of channels 572 in the chamber 566. Further, or instead, at least one portion of the at least one instance of the fin 564 may be movable toward the housing 521 in response to external pressure on the contact surface 524. As compared to a cooling plate with channels defined by structural elements that remain fixed in response to pressure, the movement of at least one portion of the at least one instance of the fin 564 in response to external pressure on the contact surface 524 facilitates compliance of the cooling plate 555 to the heat-dissipating component 504. In certain implementations, the plurality of ribs 562 and the at least one instance of the fin 564 may have the same corrosion potential as one another at least along the plurality of channels 572 in chamber 566, as may be useful for reducing the likelihood of degradation of the plurality of ribs 562 and/or the at least one instance of the fin 564 (e.g., through galvanic corrosion) in the presence of a fluid moving through plurality of channels 572 of the chamber 566.

In some implementations, each one of the plurality of channels 572 may be elongate in at least one dimension relative to a respective width of the given one of the plurality of channels 572, as may be useful for efficiently cooling the at least one instance of the fin 564 and the plurality of ribs 562 collectively defining the plurality of channels 572 and, thus, in turn, efficiently carrying heat away from the heat-dissipating component 504. Further, or instead, or more of the plurality of channels 572 may have a respective hydraulic diameter of greater than about 1 micron and less than about 1 millimeter, as may be useful for moving fluid through the plurality of channels 572 to achieve a target amount of cooling of the heat-dissipating component 504. In some instances, the plurality of channels 672 may be in fluid communication with one another within the chamber 666. As compared to channels that are not in fluid communication with one another, the fluid communication between the plurality of channels 672 may facilitate achieving more uniform and/or require less fluid for cooling along the contact surface 724 of the diaphragm 722.

In use, a fluid may be moved through the plurality of channels 572 to carry heat away from the at least one instance of the heat-dissipating component 504 in thermal communication with the fluid via the diaphragm 522. As compared to a cooling plate with fixed structural elements, the cooling plate 555 may maintain contact with the heat-dissipating component 504, thus providing robust thermal communication between the at least one instance of the heat-dissipating component 504 and the fluid in the chamber 566—even as pressure between the heat-dissipating component 504 varies initially and/or over time. Further, it shall be appreciated that, in implementations which the cooling plate 555 is coupled to multiple instances of the heat-dissipating component 504, movement of the at least one instance of the fin 564 within the chamber 566 may facilitate maintaining contact between the cooling plate 555 and the multiple instances of the heat-dissipating component 504, even as the multiple instances of the heat-dissipating component 504 exert different amounts of pressure on the cooling plate 555. It shall be appreciated that such variation in flexibility may be across a single instance of the diaphragm 522 and/or across multiple instances of the diaphragm 522, depending on, for example, the end use of the circuit pack 500.

In some implementations, a seat 578 may be disposed between the housing 521 and the second end portion 570 of the at least one instance of the fin 564 such that the second end portion 570 of the at least one instance of the fin 564 may be movable into contact with the housing 621, via the seat 578, in response to the external pressure on the contact surface 524 of the diaphragm 522. That is, the seat 578 may generally reduce the likelihood of direct contact between the at least one instance of the fin 564 moving into contact with the housing 521. More specifically, the seat 578 may reduce the likelihood of degradation of the second end portion 570 of the at least one instance of the fin 564 as the second end portion 570 moves into contact with the housing 521, a baffle (as described below), or both. As an example, the seat 578 may be compressible between the second end portion 570 of the at least one instance of the fin 564 and the housing 521 as the second end portion 570 of the at least one instance of the fin 564 moves toward the housing 521. Further, or instead, the seat 578 may include at least one water-compatible material. For example, the seat 578 may include at least one material that does not degrade upon exposure to water, such as a water-resistant material. As specific example, the water compatible material may include synthetic rubber. While the seat 578 is shown as being disposed on the second end portion 570 of the at least one instance of the fin 564, it shall be appreciated that the seat 578 may additionally, or alternatively, be supported on the housing 521, the baffle 574, or a combination thereof.

In some implementations, the housing 521 may include a plurality of sections, which may be fabricated separately from one another and coupled to one another according to any one or more of various different techniques, as may be generally useful for facilitating fabrication of the housing 521 according to various shapes and sizes suitable for various implementations. As an example, the housing 521 may include a first section 531 and a second section 532. Continuing with this example, the plurality of ribs 562 may be disposed between the first section 531 of the housing 521 and the second section 532 of the housing 521 in the chamber 566. Each one of the plurality of ribs 562 may be coupled to the first section 531 of the housing 521, the second section 532 of the housing 521, or both sections, as may be useful for achieving efficient heat transfer from the housing to each one of the plurality of ribs 562 while providing structural strength to the cooling plate 555 as the cooling plate 555 flexes to accommodate the heat-dissipating component 504. For example, each one of the plurality of ribs 562 may be directly coupled to the first section 531 of the housing 521, the second section 532 of the housing 521, or both. As a more specific example, each one of the plurality of ribs 562 may be welded, brazed, soldered, glued, or skived to the first section 531 of the housing 521, the second section 532 of the housing 521, or both sections.

In certain implementations, the first section 531 of the housing 521 may support the diaphragm 522. For example, the first section 531 of the housing 521 may be more rigid than the diaphragm 522 such that the diaphragm 522 may flex relative to the first section 531 of the housing 521 in response to external pressure of the contact surface 524 of the diaphragm 522. Accordingly, as the diaphragm 522 flexes relative to the first section 531 of the housing 521 in response to the external pressure on the contact surface 524, the least one instance of the fin 564 coupled to the diaphragm 522 may move in a direction toward the second section 532 of the housing 521 to reduce the size of the gap G or move into contact with the second section 532 of the housing 521 such that the gap G is eliminated. In certain implementations, the at least one instance of the fin 564 may remain undeformed within an elastic limit of deformation of the diaphragm 522 in a direction normal to the contact surface 524 and toward the chamber 566. That is, the at least one instance of the fin 564 may act as a hard stop to the deformation of the diaphragm 522 in response to external pressure on the contact surface 524 of the diaphragm 522.

In some implementations, the housing 521 may include a substantially planar surface 581, allowing for variations from ideal planarity associated with fabrication tolerances. The diaphragm 522 may be coupled to the substantially planar surface 581 of the housing 521, and may extend in a direction away from the substantially planar surface 581 such that the heat-dissipating component 504. For example, the contact surface 524 of the diaphragm 522 may be raised relative to a plane defined by the substantially planar surface 581 of the housing 621 521. Such spacing may be useful for initially mounting the heat-dissipating component 504 to the contact surface 524 by, for example, reducing the likelihood of unintended contact between the housing 521 and the printed circuit board 502. Further, or instead, spacing between the contact surface 524 of the diaphragm 522 and the substantially planar surface 581 may facilitate directing heat away from the heat-dissipating component 504 and into the chamber 566 of the housing 521 instead of directing such heat to other locations along the printed circuit board 502.

In some implementations, a plurality of struts 582 may be supported by at least one instance of the fin 564, the plurality of ribs 562, or a combination thereof. Each one of the plurality of struts may extend elongate in a direction transverse (e.g., perpendicular) to a longitudinal axis defined by the first end portion 568 and the second end portion 570 of at least one instance of the fin 564. The plurality of struts 582 may, for example, provide additional surface area for cooling the fluid moving through the chamber 566 of the housing 521. Further, or instead, in instances in which each end of the plurality of struts 582 is secured between instances of the fin 564 or between the at least one instance of the fin 564 and one of the plurality of ribs 562, the plurality of struts 582 may provide structural support to facilitate maintaining the shape of the plurality of channels 572 as the at least one instance of the fin 564 moves in response to changes in external pressure on the contact surface 524 of the diaphragm 522.

In certain implementations, the housing 521 may define a first port 579 and a second port 580, and the first port 579 and the second port 580 may be in fluid communication with one another via the plurality of channels 572 in the chamber 566 such that a continuous or substantially continuous flow of fluid (allowing for variations, such as pulsations, associated with certain types of pumps) through the plurality of channels 572 in the chamber 566. For example, the circuit pack may include a fluid F and a pump 567. The fluid F may be disposed in the heat-dissipating component 504, and the pump 567 may be operable to move the fluid F through the plurality of channels 572 in chamber 566 (e.g., in a direction from the first port 579 to the second port 580). For example, the pump 567 (e.g., a peristaltic pump, a diaphragm pump, or the like) may move the fluid F through a closed fluid circuit that includes the plurality of channels 572 in the chamber 556 such that the fluid F may carry heat away from chamber 556, cool along a portion of the closed fluid circuit away from the chamber 556, and recirculate back into the chamber 556 to carry heat away from the chamber 556. Such a closed fluid circuit may be particularly useful for making efficient use of the fluid F, such as implementations in which a continuous or semi-continuous source of the fluid F is unavailable or impractical to implement. Further, or instead, the self-contained nature of the closed fluid circuit may reduce or eliminate the need for maintenance of the circuit pack 500 cooled by the cooling plate 555. While the pump 567 may pump the fluid F through the chamber 556 of the cooling plate 555 as part of a closed fluid circuit, it shall be appreciated that the pump 567 may pump the fluid F through the chamber 556 may alternatively pump the fluid F through the chamber 556 as part of an open fluid circuit, such as may be useful for achieving larger amounts of heat dissipation than may be achievable with a closed fluid circuit.

In general, the fluid F may include any one or more of various different types of fluids that are liquid within at least a portion of a range of operating temperatures of the circuit pack 500, as may be useful for pumping the fluid F in the liquid phase through chamber 556. As an example, the heat-dissipating component 504 may have a predetermined threshold for a junction temperature, and the fluid F may have a vaporization temperature lower than the predetermined threshold of the junction temperature. As a more specific example, the fluid F may have a vaporization temperature greater than about −271° C. and less than about 2025° C. Examples of one or more components of the fluid F include water, alcohol, sodium, a refrigerant, or a combination thereof.

While cooling plates have been described as having at least one instance of a fin movable within the chamber to define at least a portion of a plurality channels in the chamber, it shall be appreciated that additional or alternative portions of the cooling plate may define the plurality of channels.

Figure 6A:
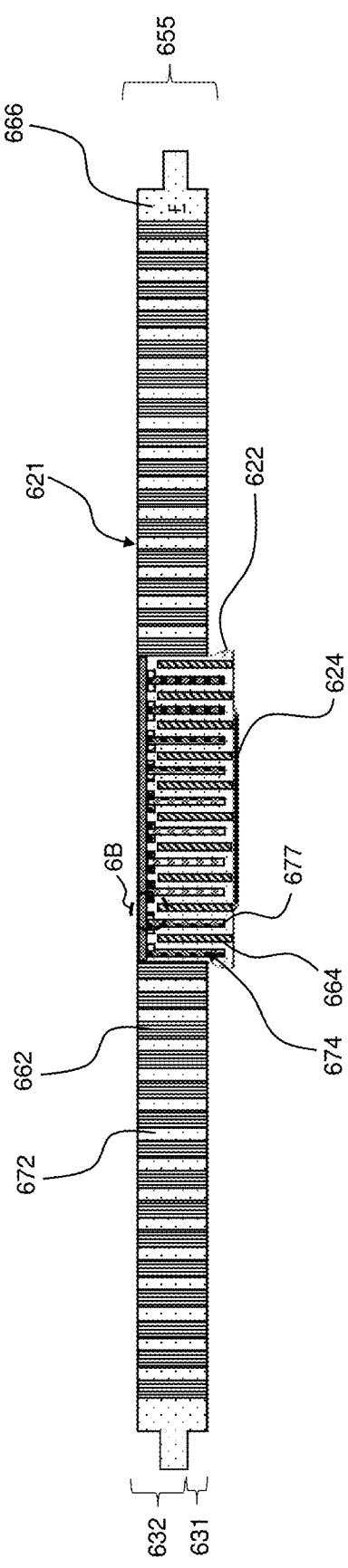
FIG. 6A is a side view of a cross-section of a cooling plate including at least one fin and a baffle, with the at least one fin movable in at least one recess defined by the baffle in response to external pressure in a contact surface of a diaphragm of the cooling plate.
Figure 6B:
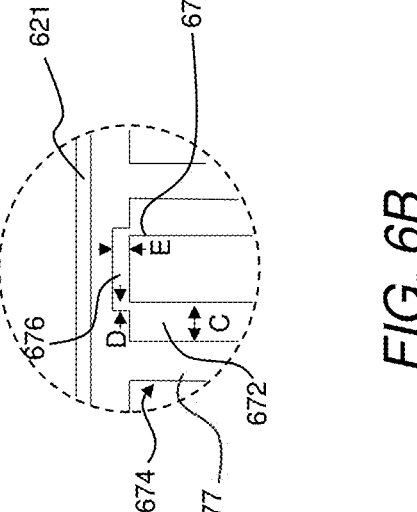
FIG. 6B is a side view of the cross-section of the cooling plate of FIG. 6A, shown enlarged along the area of detail 6B in FIG. 6A.

For example, referring now to FIGS. 6A and 6B, a cooling plate 655 may include a baffle 674 and the at least one fin 664 disposed in a housing 621. As an example, the housing 621 may include a first section 631 and a second section 632 collectively defining at least a portion of a chamber 666. The at least one fin 664 may be coupled to a diaphragm 622 supported by the first section 631 of the housing 621, and the baffle 674 may be coupled to the second section 632 of the housing 621. In response to external pressure on a contact surface 624 of the diaphragm 622 of the cooling plate 655, the at least one fin 664 may be movable within at least one recess 676 defined by the baffle 674. For example, as the at least one fin 664 moves in the at least one recess 676 defined by the baffle 674, the at least one fin 664 may move toward the housing 621 and into contact with the baffle 674 (e.g., into direct contact with the baffle 674 for conductive heat transfer from the at least one fin 664 and into the second section 632 of the housing 621 via the baffle 674) such that the baffle 674 and the at least one fin 664 define a plurality of channels 672 therebetween. For the sake of clear and efficient description, 100-series, 200-series, 300-series, and 500-series elements described above and having the same last two digits as 600-series element numbers in the portion of the description describing the cooling plate 655 shall be understood to be analogous to or interchangeable with one another, unless otherwise explicitly made clear from the context and, therefore, are not described separately from one another, except to note differences or to emphasize certain features.

The baffle 674 may include a plurality of supports 677 extending, in the chamber 666, in a direction away from the second section 632 of the housing 621 and toward the diaphragm 622. For example, the plurality of supports 677 may be interlaced with the at least one fin 664 to define at least a subset of the plurality of channels 672 therebetween in the chamber 666. In response to external pressure on the contact surface 624 of the diaphragm 622, the plurality of supports 677 may resist movement of the diaphragm 622 in a direction, into the chamber 666, toward the second section 632 of the housing 621. That is, the plurality of supports 677 may provide structural support along the chamber 666 to limit deformation of the diaphragm 622 in response to external pressure on the contact surface 624 of the diaphragm 622 and, thus, reduce the likelihood that external pressure on the contact surface 624 of the diaphragm 622 may inadvertently collapse the chamber 666 or otherwise overly restrict flow of the fluid F through the plurality of channels 672 defined in the chamber 666.

While contact between the at least one fin 664 and the baffle 674 may include mating along flat surfaces, it shall be appreciated that other types of mating are additionally or alternatively possible. For example, the at least one fin 664 and the baffle 674 may come into contact along one or more surfaces that facilitate restricting flow in a gap "E" between the at least one fin 664 and the baffle 674 in instances in which the at least one fin 664 is spaced away from the at least one recess 676 or imperfectly seated in the at least one recess 676—such as may occur in real world conditions in which external pressure on the diaphragm 662 fluctuates (e.g., decreases) over time. With the at least one fin 664 spaced away from the baffle 674, a lateral spacing "D" between the baffle 674 and the at least one fin 664 may be small compared to the respective width "C" of each of the plurality of channels 672 defined between the at least one fin 664 and the baffle 674. Because the width "C" of each of the plurality of channels 672 is greater than the lateral spacing "D" (e.g., more than twice as large) between the baffle 674 and the at least one fin 664, the plurality of channels 672 represent a smaller flow restriction compared to the flow restriction associated with the gap "E," thus promoting movement of fluid moving through the plurality of channels 672 to provide cooling to a heat-dissipating component coupled to the contact surface 624, even in instances in which contact between the at least one fin 664 and the baffle 674 is not completely flush in the recess 676—such that the gap "E" is greater than zero—as may occur through manufacturing variations and/or through changes in conditions experienced by the cooling plate 655 over time.

For the sake of clear and efficient description, the at least one fin 664 has been described as moving into contact with the baffle 674. However, other types of contact are additionally or alternatively be possible. For example, unless otherwise specified or made clear from the context, it shall be appreciated that the at least one fin 664 may additionally, or alternatively, move into direct contact with the housing 621 and/or into contact with a seat material (e.g., any one or more of the various different compressible materials described herein) compressible between the at least one fin 664 and another surface (e.g., the housing 621 and/or the baffle 674, as the case may be). Stated differently, in each instance in which mating with the baffle 674 is described, it shall be appreciated that such mating may additionally or alternatively occur between the at least one fin 664 and the housing 621, unless a contrary intent is explicitly indicated.

Figure 7:
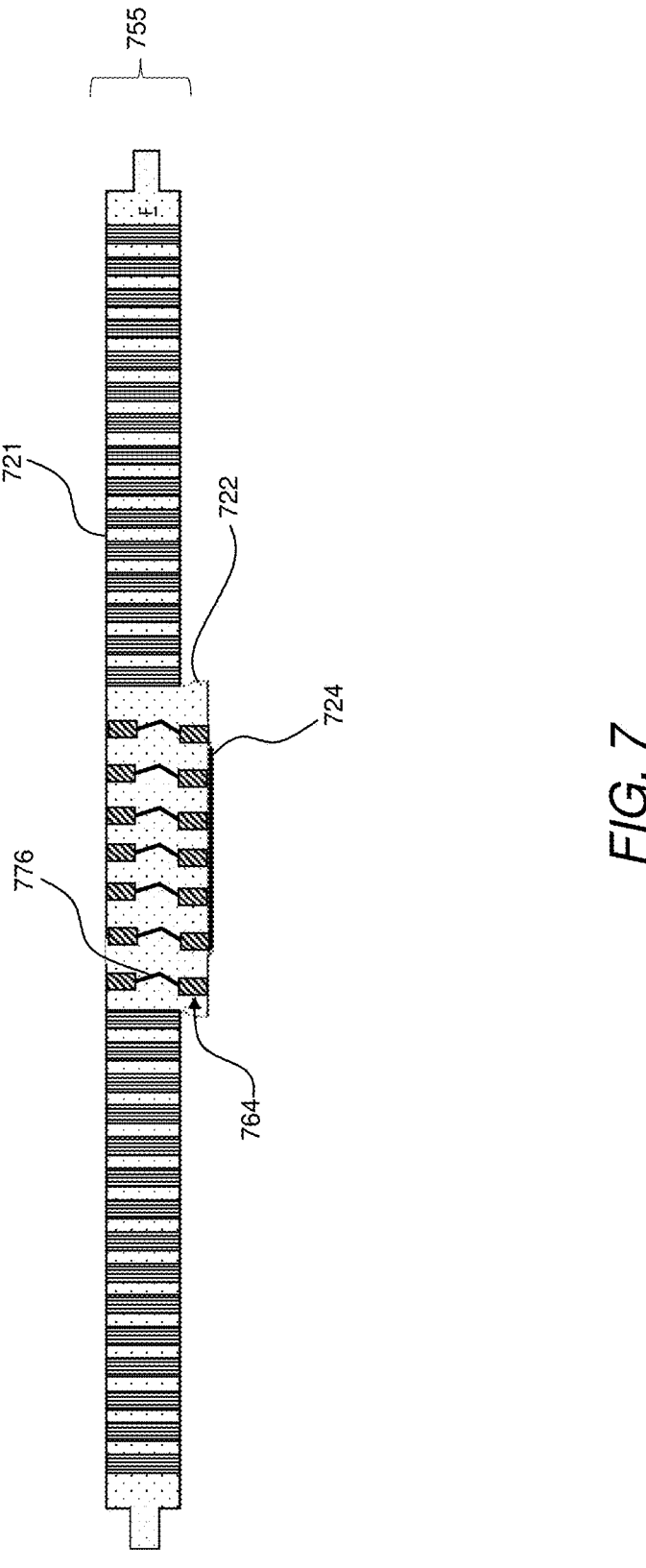
FIG. 7 is a side view of a cross-section of a cooling plate including at least one fin including flexible section compressible in response to external pressure on a contact surface of a diaphragm of the cooling plate.

Referring now to FIG. 7, a cooling plate 755 may include at least one instance of a fin 764. For the sake of clear and efficient description, 100-series, 200-serieis, 300-sieries, 500-series, and 600-series elements described above and having the same last two digits as 700-series element numbers in the portion of the description describing the cooling plate 755 shall be understood to be analogous to or interchangeable with one another, unless otherwise explicitly made clear from the context and, therefore, are not described separately from one another, except to note differences or to emphasize certain features.

In general, the at least one instance of the fin 764 may include a flexible section 776 compressible in response to external pressure on a contact surface 724 of a diaphragm 722 of the cooling plate 755. For example, in some instances, each end of the at least one instance of the fin 764 may be coupled to a housing 721 and, in response to external pressure on the contact surface 724, the flexible section 776 (e.g., between ends of the at least one instance of the fin 764) may compress or otherwise deform to absorb the pressure. Such flexibility along the flexible section 776 may result in compliance of the cooling plate 755 to facilitate maintaining robust contact between the cooling plate 755 and one or more heat-dissipating components (e.g., the heat-dissipating component 504 shown in FIG. 5A) throughout a range of pressures. As an example, the flexible section 776 of the at least one instance of the fin 764 may be corrugated, as may be useful for facilitating flexibility while also increasing surface area of the at least one instance of the fin 764 in contact with fluid moving through the chamber of the housing.

The method steps of the implementations described herein are intended to include any suitable method of causing such method steps to be performed, consistent with the patentability of the following claims, unless a different meaning is expressly provided or otherwise clear from the context. So, for example, performing the step of X includes any suitable method for causing another party such as a remote user, a remote processing resource (e.g., a server or cloud computer) or a machine to perform the step of X. Similarly, performing steps X, Y and Z may include any method of directing or controlling any combination of such other individuals or resources to perform steps X, Y and Z to obtain the benefit of such steps. Thus, method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It will be appreciated that the devices, systems, and methods described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the spirit and scope of this disclosure and are intended to form a part of the invention as defined by the following claims.

What is claimed is:

1. A cooling plate comprising:
   a housing including a first section and a second section;
   a diaphragm including a contact surface, the housing supporting the diaphragm, and the housing and the diaphragm collectively defining a chamber enclosed relative to the contact surface;
   a plurality of ribs disposed, in the chamber, between the first section of the housing and the second section of the housing;
   at least one fin including a first end portion and a second end portion, the first end portion coupled to the diaphragm with the second end portion in the chamber, and the at least one fin and the plurality of ribs collectively defining a plurality of channels in the chamber, and at least one portion of the at least one fin movable toward the housing in response to external pressure on the contact surface; and
   a baffle defining at least one recess, wherein the baffle is coupled to the second section of the housing with the at least one recess open toward the diaphragm, and the at least one fin is movable within the at least one recess in response to external pressure on the contact surface of the diaphragm.

2. The cooling plate of claim 1, wherein each one of the plurality of ribs is coupled to the first section of the housing, the second section of the housing, or both.

3. The cooling plate of claim 1, wherein the first section of the housing supports the diaphragm, and the at least one portion of the at least one fin is movable toward the second section of the housing in response to external pressure on the contact surface.

4. The cooling plate of claim 1, wherein the baffle includes a plurality of supports extending in a direction from the second section of the housing toward the diaphragm, and the plurality of supports are interlaced with the at least one fin to define at least a subset of the plurality of channels therebetween.

5. The cooling plate of claim 4, wherein, in response to external pressure on the contact surface of the diaphragm, the plurality of supports resist movement of the diaphragm in a direction, into the chamber, toward the second section of the housing.

6. The cooling plate of claim 1, wherein, in the absence of external pressure on the contact surface of the diaphragm, the second end portion of the at least one fin and the housing define a gap therebetween, and the second end portion of the at least one fin is movable toward the housing in response to the external pressure on the contact surface of the diaphragm.

7. The cooling plate of claim 6, further comprising a seat disposed between the housing and the second end portion of the at least one fin, wherein the second end portion of the at least one fin is movable into contact with the housing, via the seat, in response to the external pressure on the contact surface.

8. The cooling plate of claim 7, wherein the seat is compressible between the second end portion of the at least one fin and the housing as the second end portion of the at least one fin moves toward the housing.

9. The cooling plate of claim 7, wherein the seat includes at least one water compatible material.

10. The cooling plate of claim 1, wherein the at least one fin remains undeformed within an elastic limit of deformation of the diaphragm in a direction normal to the contact surface and toward the chamber.

11. The cooling plate of claim 1, wherein the at least one portion of the at least one fin is compressible in response to external pressure on the contact surface of the diaphragm.

12. The cooling plate of claim 1, wherein each one of the plurality of channels is elongate in at least one dimension relative to a respective width of the given channel.

13. The cooling plate of claim 1, wherein one or more of the plurality of channels has a respective hydraulic diameter of greater than about 1 micron and less than about 1 millimeter.

14. The cooling plate of claim 1, wherein the plurality of channels are in fluid communication with one another within the chamber.

15. The cooling plate of claim 14, wherein the housing defines a first port and a second port, and the first port and the second port are in fluid communication with one another via the plurality of channels in the chamber.

16. The cooling plate of claim 1, wherein the housing includes a substantially planar surface, the diaphragm is coupled to the substantially planar surface of the housing, and the contact surface of the diaphragm is raised relative to a plane defined by the substantially planar surface of the housing.

17. The cooling plate of claim 1, wherein the plurality of ribs and the at least one fin have the same corrosion potential as one another at least along the plurality of channels in the chamber.

18. The cooling plate of claim 1, further comprising a plurality of struts supported by the at least one fin, the plurality of ribs, or a combination thereof, wherein each one of the plurality of struts is elongate in a direction transverse to a longitudinal axis defined by the first end portion and the second end portion of the at least one fin.

\* \* \* \* \*